(12) United States Patent
Wang et al.

(10) Patent No.: US 7,436,114 B2
(45) Date of Patent: *Oct. 14, 2008

(54) ELECTRONIC DEVICE INCLUDING A FIRST WORKPIECE, A SECOND WORKPIECE, AND A CONDUCTIVE MEMBER SUBSTANTIALLY DIRECTLY BONDED TO THE FIRST AND SECOND WORKPIECES

(75) Inventors: Jian Wang, Goleta, CA (US); Gang Yu, Goleta, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/270,127

(22) Filed: Nov. 9, 2005

(65) Prior Publication Data

US 2006/0273307 A1    Dec. 7, 2006

Related U.S. Application Data

(60) Provisional application No. 60/687,350, filed on Jun. 3, 2005.

(51) Int. Cl.
*H01J 1/62* (2006.01)
(52) U.S. Cl. ............................ 313/504; 257/40; 257/49
(58) Field of Classification Search ................. 313/500, 313/504, 505, 506, 512, 498; 315/169.3; 257/40, 59, 72
See application file for complete search history.

(56) References Cited

U.S. PATENT DOCUMENTS

| | | | |
|---|---|---|---|
| 6,174,425 B1 | 1/2001 | Simpson et al. | |
| 6,448,710 B1 | 9/2002 | Asai et al. | |
| 6,777,870 B2 * | 8/2004 | Sundahl | 313/504 |
| 7,005,677 B2 * | 2/2006 | Park et al. | 257/72 |
| 7,132,801 B2 * | 11/2006 | Park et al. | 315/169.3 |
| 2003/0051909 A1 | 3/2003 | Kim et al. | |
| 2003/0136966 A1 | 7/2003 | Inoue et al. | |
| 2004/0097161 A1 | 5/2004 | Gourlay | |
| 2004/0150319 A1 * | 8/2004 | Tomimatsu et al. | 313/495 |
| 2005/0095878 A1 | 5/2005 | Palanisamy | |
| 2005/0158454 A1 * | 7/2005 | Lee et al. | 427/66 |

FOREIGN PATENT DOCUMENTS

GB    2 396 245 A    8/2004

OTHER PUBLICATIONS

Suk, et al., "Wetting Dynamics of Eutectic and Lead-Free Solders with Various Reflow Condiditions and Surface Finish Metallizations," IEEE, Proceedings, 55th Electronic Components and Technology Conference, May 31-Jun. 3, 2005, pp. 832-842.*

(Continued)

*Primary Examiner*—Wael Fahmy
*Assistant Examiner*—Paul E Patton
(74) *Attorney, Agent, or Firm*—John H. Lamming

(57) ABSTRACT

An electronic device can include a first workpiece, a second workpiece, and a conductive member. The first workpiece can include an electronic component that includes an electrode and an organic layer. The first workpiece can also include a substrate structure lying adjacent to the electronic component. The second workpiece can include a conductor. The conductive member can be substantially directly bonded to the electrode and the first conductor.

18 Claims, 15 Drawing Sheets

OTHER PUBLICATIONS

CRC Handbook of Chemistry and Physics, 81st Edition, 200-2001 (Book not supplied).

Patent Abstracts of Japan, Jul. 3, 2003, vol. 3, No. 07 and JP 2003/066859 A, Mar. 5, 2003, Sharp Corp., Abst. Fig. 5, Paras. 0042, 0045.

Un-Byoung Kang and Young-Ho Kim, "A New Technique Using Low Temperature Solder Bumps for LCD Driver IC Packaging Applications" In IEEE Transactions on Components and Packaging Technologies, vol. 27, No. 2, Jun. 1, 2004, pp. 253-258, IEEE, New Jersey, USA, XP-002400358.

* cited by examiner

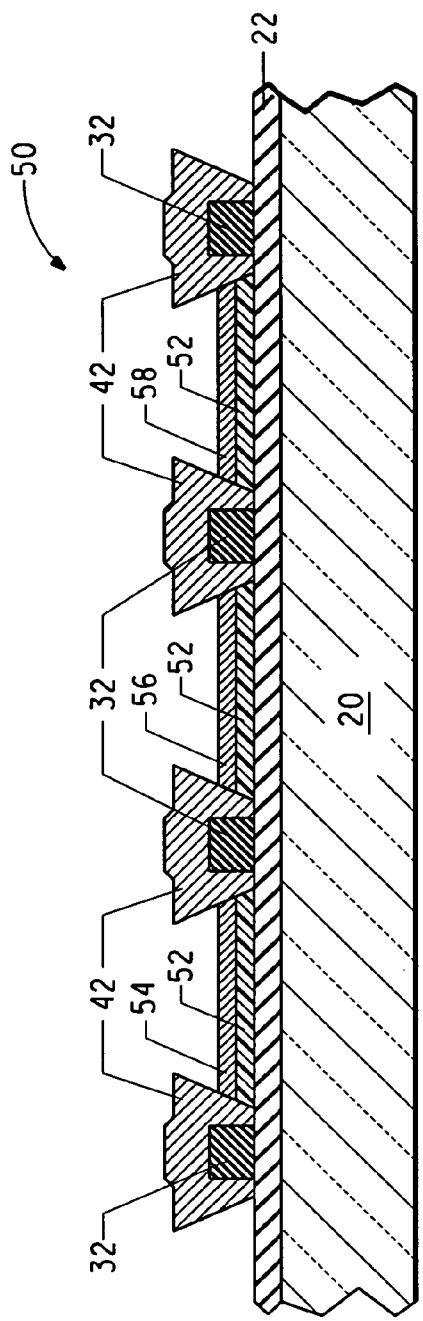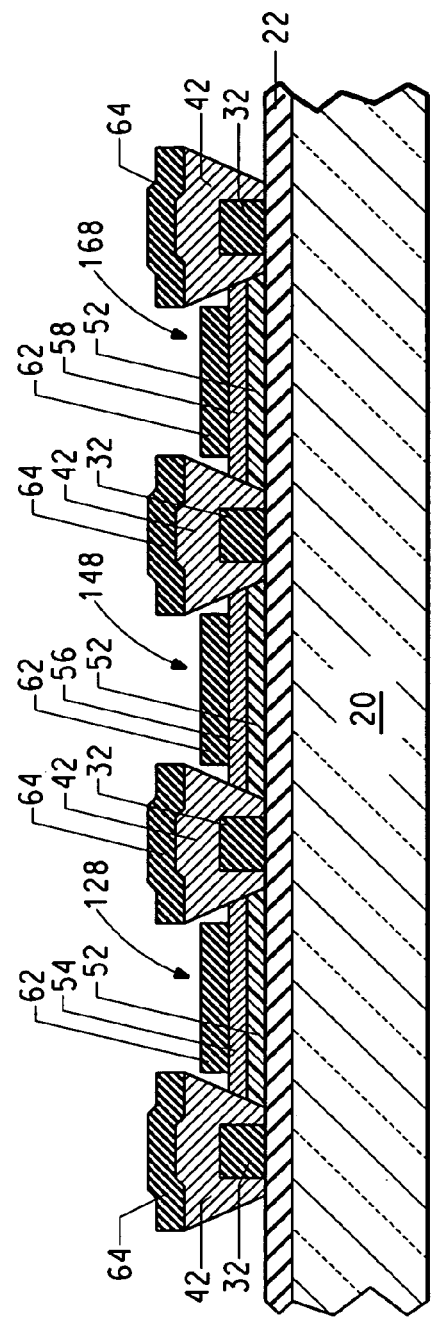
FIG. 5
FIG. 6

222

214

224

230

ELECTRONIC DEVICE INCLUDING A FIRST WORKPIECE, A SECOND WORKPIECE, AND A CONDUCTIVE MEMBER SUBSTANTIALLY DIRECTLY BONDED TO THE FIRST AND SECOND WORKPIECES

CROSS REFERENCE TO RELATED APPLICATIONS

This application claims the benefit of priority under 35 U.S.C. § 119(e) from provisional U.S. Application Ser. No. 60/687,350, filed Jun. 6, 2005, which is incorporated herein by reference in its entirety.

BACKGROUND INFORMATION

1. Field of the Disclosure

The present disclosure relates to electronic devices, and more particularly to electronic devices that include first workpieces, second workpieces, and conductive members substantially directly bonded to the first and second workpieces.

2. Description of the Related Art

Electronic devices, including organic electronic devices, continue to be more extensively used in everyday life. Examples of organic electronic devices include Organic Light-Emitting Diodes ("OLEDs"). Conventional OLED displays are typically formed from a single substrate. Whether passive matrix or active matrix, electronic circuits used to drive the OLEDs are formed before the OLEDs, themselves. Electronic circuits that are otherwise good may become effectively worthless during the fabrication of the OLEDs. For example, a fabrication defect or error when forming the OLEDs can result in operable driver circuits that are electrically connected to non-functional or poorly functioning OLEDs. In another example, fabrication of the OLEDs may render the driver circuits to be non-functional or poorly functioning due to processing conditions. Such non-functional or poorly functioning driver circuits may result from temperature cycling, plasma damage, or the like. Still further, the additional processing for the OLEDs increases the likelihood that a substrate will be dropped, fractured, misplaced, or combined with the wrong lot of substrates.

In an attempt to solve the problem, one substrate includes electronic circuits, and another substrate includes the OLEDs. To assemble the OLED panel and the driving panel together, many approaches have been proposed. An anisotropic conductor, for example, anisotropic electric conductive paste (e.g., a paste with a low density of conductors) or anisotropic electric conductive layer (e.g., an elastomeric layer with z-axis conductors) can be used. A patterned metal bump is another approach to make electrical connection between two panels. In all of these attempts, the electrical connection is achieved through physical pressure in which OLED pixels are liable to be damaged. Therefore, these processes can actually reduce the yield and increase the fabrication cost. To reduce the effects of such disadvantages, a passivation layer can be introduced to protect the OLED pixels or the OLED pixels can be made on the other side of the OLED substrate. In these two approaches, an additional process of making micro vias through the passivation layer or substrate is required. Making micro vias for millions of pixels is a difficult process.

SUMMARY

In a first aspect, an electronic device can include a first workpiece that includes a first electronic component. The first electronic component can include a first electrode and a first organic layer, and a substrate structure can lie adjacent to the first electronic component. The electronic device can also include a second workpiece that includes a first conductor. The electronic device can still further include a first conductive member that is substantially directly bonded to the first electrode and the first conductor.

In a second aspect, an electronic device can include a first workpiece. The first workpiece can include a first electronic component including a radiation-emitting component; that includes a first electrode and a first active organic layer; and a substrate structure lying adjacent to the first electronic component. The electronic device can also include a second workpiece including a first control circuit to control the first electronic component, wherein the first control circuit is electrically connected to a first conductor. The substrate structure contacts the second workpiece; or a layer overlying the substrate structure contacts the second workpiece, wherein the layer has a substantially same composition as the first electrode. The electronic device can also include a first conductive member that is substantially directly bonded to the first electrode and the first conductor.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

FIG. 5 includes an illustration of a cross-sectional view of the workpiece of FIG. 4 after forming an organic layer between openings within the well structures.

FIG. 6 includes an illustration of a cross-sectional view of the workpiece of FIG. 5 after forming other electrodes.

Figure 1:
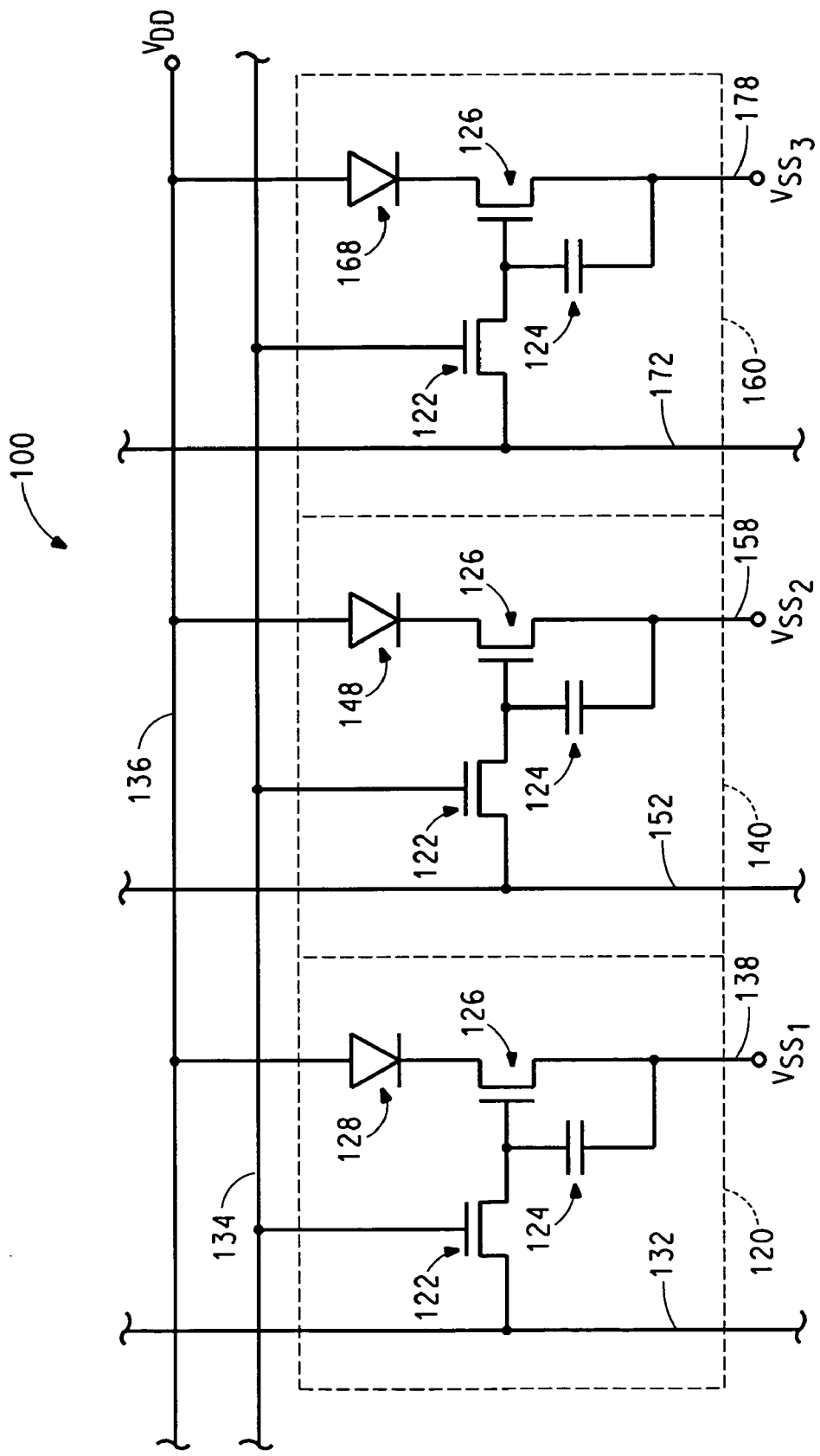
FIG. 1 includes an illustration of a circuit diagram of a portion of an AMOLED display that can be made using the processes described herein.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

In a first aspect, an electronic device can include a first workpiece that includes a first electronic component. The first electronic component can include a first electrode and a first organic layer, and a substrate structure can lie adjacent to the first electronic component. The electronic device can also include a second workpiece that includes a first conductor. The electronic device can still further include a first conductive member that is substantially directly bonded to the first electrode and the first conductor.

In one embodiment of the first aspect, a width of the first conductive member at a point about halfway between the first electrode and first conductor is wider than a width of the first conductive member at a point closer to the first electrode or the first conductor. In another embodiment, the first conductive member has a height of at least 3.5 microns.

In a further embodiment of the first aspect, the electronic device further includes at least 4,000 other conductive members. The first workpiece further includes at least 4,000 other electronic components, wherein each of the at least 4,000 other electronic components includes a first electrode. The second workpiece further includes other conductors substantially similar to the first conductor. Each of first conductive member and the at least 4,000 other conductive members is substantially directly bonded to at least one of the first electrodes and to the first conductor or any of at least 4,000 other conductors.

In still another embodiment of the first aspect, the first electronic component includes a radiation-emitting component, a radiation-responsive component, or a combination thereof. The second workpiece includes a first control circuit to control the first electronic component, wherein the first control circuit is electrically connected to the first conductor. In a particular embodiment, the radiation-emitting component, radiation-responsive component, or combination thereof, emits radiation or responds to radiation transmitted through the first workpiece, the second workpiece, or a combination thereof.

In another particular embodiment of the first aspect, the electronic device further includes a second conductive member and a third conductive member. The first electronic component is a red light-emitting component, and the first organic layer includes a red light-emitting organic layer. The first workpiece further includes a green light-emitting component that includes a first electrode and a green light-emitting organic layer, and a blue light-emitting component that includes a first electrode and a blue light-emitting organic layer. The substrate structure lies between the red light-emitting component, the green light-emitting component, and the blue light-emitting component. The second workpiece also includes a second control circuit to control the green light-emitting component, wherein the second control circuit is electrically connected to a second conductor, and a third control circuit to control the blue light-emitting component, wherein the third control circuit is electrically connected to a third conductor. The second conductive member is substantially directly bonded to the first electrode of the green light-emitting component and the second conductor, and the third conductive member is substantially directly bonded to the first electrode of the blue light-emitting component and the third conductor.

In a more particular embodiment of the first aspect, the red light-emitting component, the green light-emitting component, and the blue light-emitting component share a common electrode. Radiation is transmitted through the common electrode of the red light-emitting component, the green light-emitting component, and the blue light-emitting component.

In another embodiment of the first aspect, the first component is at least part of a backlight, a static image display, a passive matrix display, a sensor array, or a photovoltaic cell. In a further embodiment, the substrate structure contacts the second workpiece, or a layer overlying the substrate structure contacts the second workpiece, wherein the layer has a substantially same composition as the first electrode. In still another embodiment, the electronic device further includes a sealing material, wherein the sealing material is attached to the first and second workpieces outside of an array that includes the first electronic component, and a gas contacts and laterally surrounds the first conductive member. In a particular embodiment, the electronic device further includes a second conductive member, wherein each of the first and second conductive members contacts the first electrode and the first conductor.

In still another embodiment of the first aspect, the electronic device further includes an encapsulating layer that contacts the first workpiece, the second workpiece and the first conductive member. In another embodiment, the first conductive member includes a metal-containing material having at least one void.

In a second aspect, an electronic device can include a first workpiece. The first workpiece can include a first electronic component including a radiation-emitting component; that includes a first electrode and a first active organic layer; and a substrate structure lying adjacent to the first electronic component. The electronic device can also include a second workpiece including a first control circuit to control the first electronic component, wherein the first control circuit is electrically connected to a first conductor. The substrate structure contacts the second workpiece; or a layer overlying the substrate structure contacts the second workpiece, wherein the layer has a substantially same composition as the first electrode. The electronic device can also include a first conductive member that is substantially directly bonded to the first electrode and the first conductor.

In one embodiment of the second aspect, a width of the first conductive member at a point about halfway between the first electrode and first conductor is wider than a width of the first conductive member at a point closer to the first electrode or the first conductor. In another embodiment, the first conductive member includes a metal-containing material having at least one void.

In still another embodiment of the second aspect, the radiation-emitting component emits radiation through the first workpiece, the second workpiece or a combination thereof. In yet another embodiment, a surface energy of the first conductor is lower than a surface energy of the conductive members. In another embodiment, wherein the first conductive member has a melting point no greater than 240° C.

Many aspects and embodiments have been described above and are merely exemplary and not limiting. After reading this specification, skilled artisans appreciate that other aspects and embodiments are possible without departing from the scope of the invention.

Other features and advantages of the invention will be apparent from the following detailed description, and from the claims. The detailed description first addresses Definitions and Clarification of Terms followed by the Exemplary Circuit Design, First Workpiece (Organic Panel) Fabrication, Second Workpiece (Back Panel) Fabrication, Aligning the First and Second Workpieces and Reflow, Electronic Device and Its Operation, Alternative Embodiments, Advantages, and finally Examples.

1. Definitions and Clarifications of Terms

Before addressing details of embodiments described below, some terms are defined or clarified.

The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "attach" and it variants are intended to mean physically connecting two or more members, two or more structures, or one or more members and one or more structures to each other with or without an adhesive material.

The term "averaged," when referring to a value, is intended to mean an intermediate value between a high value and a low value. For example, an averaged value can be an average, a geometric mean, or a median.

The term "backlight" is intended to mean a portion of an electronic device that is designed to emit radiation over a large area that is not patterned. In one embodiment, a backlight is oriented such that radiation is principally directed towards a portion of a display, as opposed to the user, wherein the backlight illuminates content that is to be viewed by a user of the electronic device.

The term "blue light-emitting component" is intended to mean an electronic component capable of emitting radiation that has an emission maximum at a wavelength in a range of approximately 400 to 500 nm.

The term "blue light-emitting organic layer" is intended to mean an organic layer capable of emitting radiation that has an emission maximum at a wavelength in a range of approximately 400 to 500 nm.

The term "common electrode" is intended to mean a member, a structure, or a combination thereof configured to transport carriers to or from a plurality of electronic components. For example, a common anode includes anode portions that act as anodes for the plurality of electronic components.

The term "electrically connected," or any variant thereof, with respect to electronic components, circuits, or portions thereof, is intended to mean that two or more electronic components, circuits, or any combination of at least one electronic component and at least one circuit do not have any intervening electronic component lying between them. Parasitic resistance, parasitic capacitance, or both are not considered electronic components for the purposes of this definition. In one embodiment, electronic components are electrically connected when they are electrically shorted to one another and lie at substantially the same voltage. Note that electrically connect includes one or more connections that allow optical signals to be transmitted. For example, electronic components can be electrically connected together using fiber optic lines to allow optical signals to be transmitted between such electronic components.

The term "control circuit" is intended to mean a circuit within an array of pixels or subpixels that controls the signal(s) for no more than one pixel. In one embodiment, each pixel has one control circuit, and in another embodiment, each subpixel has one control circuit The term "electrically coupled," or any variants thereof, is intended to mean an electrical connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. A non-limiting example of "electrically coupled" can include a direct electrical connection between electronic component(s), circuit(s) or electronic component(s) or circuit(s) with switch (es) (e.g., transistor(s)) electrically connected between them.

The term "directional radiation source" is intended to mean equipment capable of generating radiation that can be directed to a specific point, area, or region. A directional radiation source can include a laser.

The term "directly bond," or any variant thereof, is intended to mean an attachment of two or more members, two or more structures, or one or more members and one or more structures, wherein such attachment remains in the absence of an adhesive material. For example, a conductive member that is attached to a conductor only by an adhesive material (e.g., an epoxy) is not directly bonded to the conductor since such conductive member would not be attached if the adhesive material would be removed. A solder connection between conductors can be formed by direct bonding.

The term "electrode" is intended to mean a member, a structure, or a combination thereof configured to transport carriers within an electronic component. For example, an electrode may be an anode, a cathode, a capacitor electrode, a gate electrode, etc. An electrode may include a part of a transistor, a capacitor, a resistor, an inductor, a diode, an electronic component, a power supply, or any combination thereof.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors electrically connected to different electronic components where a capacitor between the conductors is unintended or incidental).

The term "electronic device" is intended to mean a collection of circuits, electronic components, or combinations thereof that collectively, when properly electrically connected and supplied with the appropriate potential(s), performs a function. An electronic device may include or be part of a system. An example of an electronic device includes a display, a sensor array, a computer system, an avionics system, an automobile, a cellular phone, other consumer or industrial electronic product, or any combination thereof.

The term "encapsulating layer" is intended to mean that a layer that is used to help keep an ambient outside of the electronic device from significantly diffusing or otherwise migrating to one or more electronic components within the electronic device protected by such layer.

The term "eutectic," when referring to a composition of a metallic alloy is intended to mean that such composition has a melting point lower than the melting points of each metal within the metallic alloy. In one embodiment, a metallic alloy can have a composition that may or may not be the lowest possible melting temperature that can be achieved for the combination of metals within the metallic alloy.

The term "fabricate" is intended to mean a process to form an electronic device, which when successful, yields a functional electronic device.

The term "green light-emitting component" is intended to mean an electronic component capable of emitting radiation that has an emission maximum at a wavelength in a range of approximately 500 to 600 nm.

The term "green light-emitting organic layer" is intended to mean an organic layer capable of emitting radiation that has an emission maximum at a wavelength in a range of approximately 500 to 600 nm.

The term "organic active layer" is intended to mean one or more organic layers, wherein at least one of the organic layers, by itself, or when in contact with a dissimilar material is capable of forming a rectifying junction.

The term "organic layer" is intended to mean one or more layers, wherein at least one of the layers comprises a material including carbon and at least one other element, such as hydrogen, oxygen, nitrogen, fluorine, etc.

The term "primary surface" is intended to mean a surface of a substrate from which an electronic component is subsequently formed.

The term "radiation-emitting component" is intended to mean an electronic component, which when properly biased, emits radiation at a targeted wavelength or spectrum of wavelengths. The radiation may be within the visible-light spectrum or outside the visible-light spectrum (UV or IR). A light-emitting diode is an example of a radiation-emitting component.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "rectifying junction" is intended to mean a junction within a semiconductor layer or a junction formed by an interface between a semiconductor layer and a dissimilar material, in which charge carriers of one type flow easier in one direction through the junction compared to the opposite direction. A pn junction is an example of a rectifying junction that can be used as a diode.

The term "red light-emitting component" is intended to mean an electronic component capable of emitting radiation that has an emission maximum at a wavelength in a range of approximately 600 to 700 nm.

The term "red light-emitting organic layer" is intended to mean an organic layer capable of emitting radiation that has an emission maximum at a wavelength in a range of approximately 600 to 700 nm.

The term "reflow" and its variants are intended to mean to apply energy to a layer, a member, a structure, or any combination thereof sufficient to cause a shape of such layer, member, structure, or any combination thereof to significantly change. In one embodiment, reflowing can include melting a material within a conductive member. In another embodiment, reflowing can include reaching or exceeding a flow temperature (e.g., 960° C. for $SiO_2$).

The term "repair" and its variants are intended to mean to fix at least a portion of an electronic device without (1) disassembling and (2) re-fabricating, reassembling, or a combination of re-fabricating and reassembling the electronic device. In one embodiment, repairing can be performed after testing is performed to determine which part or parts of an electronic device are non-functional (e.g., an electrical short, an electrical opening, etc.) or operating outside a specified limit (e.g., emission intensity is too low).

The term "reversibly disassembled," with respect to an electronic device, is intended to mean that such electronic device or portion thereof can be disassembled without significantly adversely affecting electronic components within the electronic device or a portion thereof.

The term "reversibly reassembled," with respect to an electronic device, is intended to mean that such electronic device or portion thereof can be reassembled without significantly adversely affecting electronic components within the electronic device or a portion thereof.

The term "sealing material" is intended to mean that a material that is used within an electronic device to help keep an ambient within the electronic device and an ambient outside the electronic device from intermixing to any significant degree.

The term "static image display" is intended to mean that a display having an image that does not significantly change. A display can still be considered a static image display even through such display may experience a change in brightness, tone, or both due to degradation, aging, or both of electronic components (e.g., radiation-emitting components, transistors, etc.) within the display.

The term "substantially similar" is intended to mean that, when two or more members, two or more structures, or one or more members and one or more structures are compared to each other by one of ordinary skill in the relevant art, such two or more members, two or more structures, or one or more members and one or more structures do not differ in a significant manner.

The term "substrate" is intended to mean a base material that can be either rigid or flexible and may be include one or more layers of one or more materials, which can include, but are not limited to, glass, polymer, metal or ceramic materials or combinations thereof. The reference point for a substrate is the beginning point of a process sequence. The substrate may or may not include electronic components, circuits, or conductive members.

The term "user surface" is intended to mean a surface of the electronic device principally used during normal operation of the electronic device. In the case of a display, the surface of the electronic device seen by a user would be a user surface. In the case of a sensor or photovoltaic cell, the user surface would be the surface that principally transmits radiation that is to be sensed or converted to electrical energy. Note that an electronic device may have more than one user surface.

The term "void," when referring to a member, a structure, or any combination thereof is intended to mean a region within such member, structure, or any combination thereof that has the absence of any solid material.

The term "workpiece" is intended to mean a substrate and, if present, one or more layers overlying the substrate at any particular point of a process sequence. Note that the substrate may not significantly change during a process sequence, whereas the workpiece significantly changes during the process sequence. For example, at a beginning of a process sequence, the substrate and workpiece are the same. After a layer is formed over the substrate, the substrate has not changed, but now the workpiece includes the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Exemplary Circuit Design

FIG. 1 is an illustration of one of many possible circuit designs for an electronic device. FIG. 1 includes a circuit diagram of a portion of an electronic device 100. The electronic device 100 includes a first pixel 120, a second pixel 140, and a third pixel 160. Each of the pixels 120, 140, and 160 includes a pixel circuit as illustrated in FIG. 1. Each pixel circuit includes a control circuit and an electronic component 128, 148, or 168.

The first pixel 120 includes a select transistor 122, a capacitive electronic component 124, a driving transistor 126, and an electronic component 128. The electronic component 128 can be nearly any electronic component that is driven by an electrical current. In one device, the electronic component 128 is a radiation-emitting component, such as an OLED. Within pixel 120, the control circuit includes the select transistor 122, the capacitive electronic component 124, and the driving transistor 126.

The select transistor 122 includes a gate electrode electrically connected to a select line ("SL") 134, a first source/drain ("S/D") region electrically connected to a data line ("DL") 132, and a second S/D region electrically connected to a first electrode of a capacitive electronic component 124, and a gate electrode of a power transistor 126. The SL 134 provides a control signal for the select transistor 122, and the DL 132 provides a data signal to be passed to the capacitive electronic component 124 and the gate electrode of the power transistor 126 when the select transistor 122 is activated.

The capacitive electronic component 124 includes the first electrode and a second electrode. The first electrode of the capacitive electronic component 124 is electrically connected to the second S/D region of the select transistor 122 and the gate electrode of the power transistor 126. The second electrode of the capacitive electronic component 124 is electrically connected to a power supply line, which in one circuit design is a $V_{SS1}$ line 138. In an alternative circuit design (not illustrated), an optional anti-degradation unit may be electrically connected to the capacitive electronic component 124 and at least one of the power supply lines (e.g., $V_{SS1}$ line 138, $V_{DD}$ line 136, or both) electrically connected to the pixel 120.

The power transistor 126 includes the gate electrode, a first S/D region, and a second S/D region. The first S/D region of the power transistor 126 is electrically connected to an electrode of the electronic component 128, and the second S/D region of the power transistor 126 is electrically coupled to the $V_{SS1}$ line 138. In one circuit design, the second S/D region of the power transistor 126 is electrically connected to the $V_{SS1}$ line 138. In another circuit design, the optional anti-degradation unit may be electrically connected to the second S/D region of the power transistors 126 and the $V_{SS1}$ line 138.

The electronic component 128 includes the electrode, which is an anode in one configuration, and another electrode, which is a cathode in that same configuration. The electrode that is an anode is electrically connected to the common $V_{DD}$ line 136. In another configuration, the electronic component 128 is an organic, radiation-emitting electronic component, such as an OLED. The rest of the pixel circuit, which is the control circuit in one configuration, is well suited for providing a variable current source to drive the electronic component 128. Therefore, one or more electronic components that are current driven may be used in place of or in conjunction with the electronic component 128. Note that one or more electronic components may or may not include a diode.

In other electronic devices, the electronic component 128 and power transistor 126 may be reversed. More specifically, (1) the electrode that is the anode of the electronic component 128 is electrically connected to one of the S/D regions of the power transistor 126, (2) the electrode that is the cathode of the electronic component 128 is electrically connected to the $V_{SS1}$ line 138, and (3) the other S/D region of the power transistor 126 is electrically connected to the $V_{DD}$ line 136.

The second pixel 140 is similar to the first pixel 120 except that, within the second pixel 140, a data line 152 is electrically connected to a first S/D region of the select transistor 122, a $V_{SS2}$ line 158 is electrically connected to second S/D region of the power transistor 126, and an electronic component 148 is electrically connected between a first S/D region of the power transistor 126 and the $V_{DD}$ line 136. The third pixel 160 is similar to the first and second pixels 120 and 140 except that, within the third pixel 160, a data line 172 is electrically connected to a first S/D region of the select transistor 122, a $V_{SS3}$ line 178 is electrically connected to second S/D region of the power transistor 126, and an electronic component 168 is electrically connected between a first S/D region of the power transistor 126 and the $V_{DD}$ line 136.

In some circuit designs, the electronic components 128, 148, and 168 may be substantially identical to one another. In other circuit designs, the electronic components 128, 148, and 168 are different from one another. For example, the electronic component 128 is a red light-emitting component, the electronic component 148 is a green light-emitting component, and the electronic component 168 is a blue light-emitting component. The $V_{SS1}$, $V_{SS2}$, and $V_{SS3}$ lines 138, 158, and 178 may be at the same or different voltages compared to one another. In another circuit design (not illustrated), the electrodes that are the cathodes in one electronic device of the electronic components 128, 148, 168 may be electrically connected to different power supply lines (rather than all electrically connected to the common $V_{DD}$ line 136) that may operate at substantially the same or significantly different voltages. After reading this specification, skilled artisans will be able to design the electronic device 100 to meet the needs or desires for a specific application.

The select transistor 122, the power transistor 126, or any combination thereof can include a field-effect transistor, and in a particular circuit design, can be a thin film transistor ("TFT"). In the circuit for the pixel as illustrated in FIG. 1, all transistors are n-channel transistors. Any one or more of the n-channel transistors can be replaced by any one or more p-channel transistors. In other circuit designs, other transistors (including one or more junction field-effect transistors ("JFETs"), one or more bipolar transistors, or any combination thereof) may be used within the select transistor 122.

3. First Workplace Fabrication

FIGS. 2 to 6 include illustrations of cross-sectional views of portions of the electronic device during the formation of the electronic components 128, 148, and 168, as illustrated in FIG. 1. These drawings (FIGS. 2 to 6) merely illustrate one example of one layout of the electronic components 128, 148, and 168 and a fabrication sequence for forming the electronic components 128, 148, and 168 and their interconnects within the circuits. In this illustration, the electronic components 128, 148, and 168 include organic layers in one type of an organic electronic device. After reading this specification, skilled artisans will appreciate that the electronic components can be arranged differently and fabricated via an alternative sequence to achieve the circuits as illustrated in FIG. 1.

Figure 2:
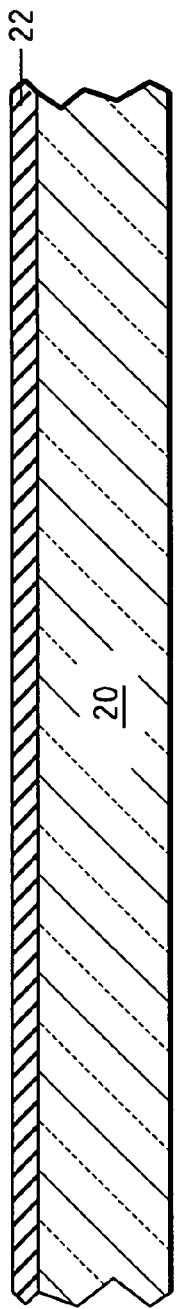
FIG. 2 includes an illustration of a cross-sectional view of a portion of a workpiece after forming a common electrode.

FIG. 2 includes a cross-sectional view of a portion of a substrate 20 after forming a common electrode 22, which in one embodiment is a common electrode for a pixel array for an AMOLED display. In a particular embodiment, the common electrode is a common anode. The substrate 20 may be a conventional substrate as used in the organic electronic device arts. The substrate 20 can be flexible or rigid, organic or inorganic. Generally, glass or flexible organic films are used as a support. The substrate 20 may comprise a ceramic, glass, metallic or organic material, or combinations thereof and can have a thickness in a range of approximately 12 to 2500 microns.

In one embodiment, the common electrode 22 is transparent and allows at least 70% of the radiation reaching the common electrode 22 to be transmitted through the common electrode 22. The common electrode 22 may cover substantially all of the array, and little or none of the area of the substrate 20 outside the array. An exemplary material includes indium tin oxide ("ITO"), zinc tin oxide ("ZTO"), an elemental metal, a metal alloy, or any combination thereof. ITO and ZTO may be thicker when used as the common electrode 22 and still allow sufficient transmission of radiation. For example, when ITO or ZTO are used as the common electrode 22, the common electrode 22 may have a thickness in a range of approximately 20 to 200 nm. In a particular embodiment when ITO is used for the common electrode 22, the thickness of the ITO layer can be in a range of approximately 50 to 150 nm. The common electrode 22 is formed using a conventional technique, such as selective deposition using a stencil mask or blanket deposition and a conventional lithographic technique to remove portions of the common electrode layer lying outside the array.

Figure 3:
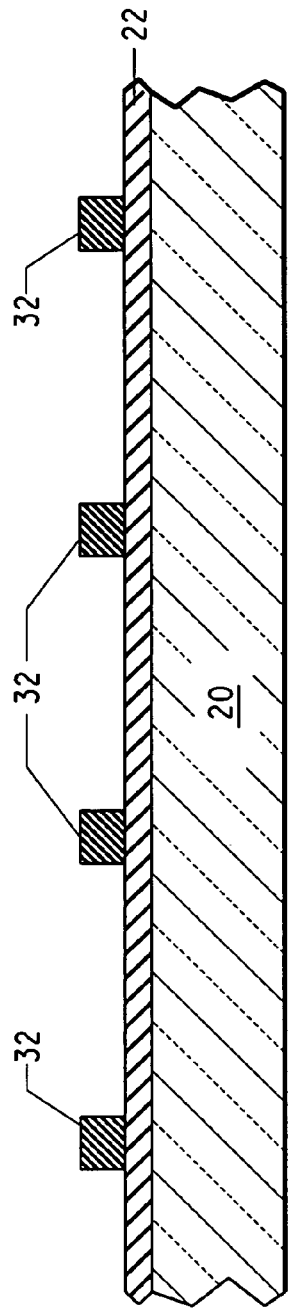
FIG. 3 includes an illustration of a cross-sectional view of the workpiece of FIG. 2 after forming conductive members over the common electrode.

One or more conductive members 32 are formed over the substrate 20 and common electrode 22, as illustrated in FIG. 3. The conductive members 32 can act as power transmission lines and extend at least partially across the array, and in one embodiment, extend across substantially all of a dimension (row or column) of the array. Referring to FIG. 3, the conductive members 32 may extend across substantially all of the columns of the array. In one particular embodiment, the conductive members 32 are inorganic, metal-containing power transmission lines. In one embodiment, the conductive members 32 may be in the form of columns (as illustrated in FIG. 3) or rows. In another embodiment, a single conductive member 32 can be in the form of a lattice with openings at locations where radiation-emitting or radiation-responsive components will be formed.

Because the conductive members 32 do not need to transmit radiation, they can be substantially thicker and more conductive than the common electrode 22. The conductive members 32 may have a thickness in a range of approximately 500 nm to 500 microns. In one embodiment, the conductive members 32 may be thicker than 2000 nm, and their thicknesses may be limited by other issues unrelated to radiation (e.g., film stress, step coverage of subsequently layers over the conductive members 32, etc.).

The conductive members 32 can comprise one or more highly conductive materials including a metal, mixed metal, alloy, metal oxide, metal nitride, mixed-metal oxide, mixed-metal nitride, or a combination thereof. An exemplary metallic element used in the conductive members 32 can include Ni, Cu, Al, Au, Ag, W, Ta, any alloy of such metals or any combination thereof. In an alternative embodiment, another conductive material, such as conductive polymers, can be used in addition to or in place of the highly conductive materials. The length and width of the conductive members 32 may be determined by the layout of the electronic device. Resistivity (i.e., selection of material(s)) and thickness can be varied without significantly affecting the layout. If a material with a higher resistivity is used, the conductive members 32 may be thicker to keep the line resistance within acceptable limits. The conductive members 32 are formed using a conventional technique, such as selective deposition using a stencil mask or blanket deposition and a conventional lithographic technique to remove portions of the conductive layer to form the conductive members 32.

Although not illustrated in FIG. 3, an optional black layer may underlie the conductive members 32 or the common electrode 22 to improve contrast, particularly for reducing background luminescence. A nearly limitless number of materials can be used for a black layer. If the optional black layer lies between the conductive members 32 and the common electrode 22, the optional black layer can have electrical characteristics that vary from conductive to resistive to insulative. If the optional black layer lies between the conductive members 32 and the common electrode 22, the optional black layer can be insulative if at least some openings though the optional black layer allow the conductive members 32 and the common electrode 22 to contact each other or if another electrical connection is made between the conductive members 32 and the common electrode 22 (e.g., conductive sidewall spacers formed adjacent to sides of the conductive members 32 and contacting the conductive members 32 and the common electrode 22). The optional black layer can be formed using a conventional technique, such as selective deposition using a stencil mask or blanket deposition and a conventional lithographic technique to remove portions that are not or will not covered by the conductive members 32.

Figure 4:
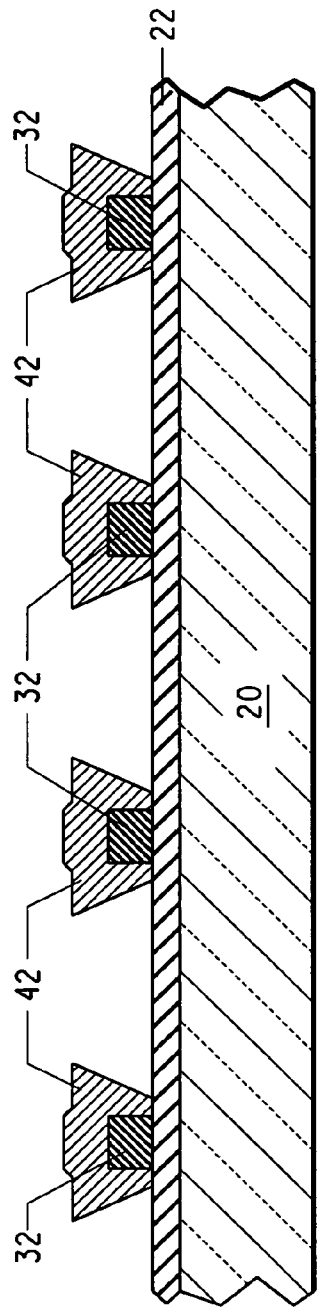
FIG. 4 includes an illustration of a cross-sectional view of the workpiece of FIG. 3 after forming well structures.

One or more substrate structures 42 may be formed, as illustrated in FIG. 4. An example of the substrate structure 42 can include a well structure, a cathode separator, or the like. The substrate structures 42 may be oriented in rows or columns or appear as a lattice from a top view. The substrate structures 42 define where the radiation-emitting components will be formed. In one embodiment, the substrate structures 42 define areas where portions of an organic layer will be formed. Each opening within the substrate structures 42 may correspond to a radiation-emitting component. The substrate structures 42 may help to keep different materials of organic layers away from one another. In another embodiment, the well structures can help to keep red and green light-emitting materials from entering the area for a blue light-emitting component. The well structures may also help to electrically insulate subsequently-formed electrodes from being electrically connected to one another.

The substrate structures 42 include one or more layers of material(s) that are relatively inert to subsequent processing, not opaque to the radiation, and are electrically insulating. Some non-limiting exemplary materials include radiation imageable materials (e.g., photoresists, including positive acting (Novolac) and negative acting, polyimide, etc.), silicon nitride, silicon oxide (including silicon dioxide, siloxanes, spin-on glass, etc.), undoped or lightly doped silicon, metal oxides, metal nitrides, metal oxynitrides, and combinations thereof.

The substrate structures 42 may be formed by depositing layer(s) of material(s) and then patterning those layer(s) or by forming the pattern as the layer(s) for the substrate structures 42 is deposited. For the purposes of this specification, deposition is to be construed broadly to include liquid or vapor deposition techniques used in the microelectronics art (OLED, flat panel, semiconductor and other similar arts). After the substrate structures 42 are formed, the sides of the substrate structures 42 may have a negative slope (angle defined by sides of the substrate structures 42 and primary surface of the substrate 20), as illustrated in FIG. 4, a positive slope or form substantially vertical walls.

The height of the substrate structures 42 can be in a range of 1 to 10 microns. Shorter or taller heights may be used in other embodiments. In one embodiment, the substrate structures 42 may be used as at least part of a "stand-off" to reduce the likelihood of contact between a subsequently-formed electrode and a conductive member attached to a second workpiece that is described later is this specification. In another embodiment that is described in the Alternative Embodiments section, the substrate structures 42 can reduce the likelihood of contact between a subsequently-formed conductive member attached to the first workpiece and a conductor on a second workpiece when the conductive member is initially formed over the substrate 20.

An optional treatment of the substrate structures 42 may be performed to change the surface energy of the substrate structures 42. In one particular embodiment, the substrate structures 42 may receive a fluorine treatment (e.g., exposure to a fluorine plasma) to make the exposed surfaces of the substrate structures 42 hydrophobic. Skilled artisans appreciate that one or more other optional treatments may be done in place of or in conjunction with the fluorine treatment.

An organic layer 50 is formed over the common electrode 22, as illustrated in FIG. 5. The organic layer 50 may include one or more layers. The organic layer 50 includes one or more organic active layers 54, 56, and 58, and optionally, may contain any one or more of a buffer layer, a charge-injection layer, a charge-transport layer, a charge-blocking layer, or any combination thereof. The optional buffer layer, charge-injection layer, charge-transport layer, charge-blocking layer, or any combination thereof may lie between the organic active layers 54, 56, and 58 and the common electrode 22, between the organic active layers 54, 56, and 58 and a subsequently-formed electrode layer, or a combination thereof. In one embodiment, a hole-transport layer 52 lies between the common electrode 22 and the organic active layers 54, 56, and 58.

The formation of the organic layer 50 is performed using any one or more conventional deposition techniques used in forming organic layers in OLEDs. In one embodiment, the hole-transport layer 52 can include an organic polymer, such as polyaniline ("PANI"), poly(3,4-ethylenedioxythiophene) ("PEDOT"), or an organic charge transfer compound, such as tetrathiafulvalene tetracyanoquinodimethane (TTF-TCQN). The hole-transport layer typically has a thickness in a range of approximately 50 to 250 nm.

Each of the organic active layers 54, 56, and 58 can include one or more small molecule materials, one or more polymeric materials, or a combination thereof. Small molecule materials may include those described in, for example, U.S. Pat. No. 4,356,429 and U.S. Pat. No. 4,539,507. Alternatively, polymeric materials may include those described in U.S. Pat. No. 5,247,190, U.S. Pat. No. 5,408,109, and U.S. Pat. No. 5,317,169. An exemplary material is a semiconducting conjugated polymer. An example of such a polymer is poly (phenylenevinylene) referred to as "PPV." The light-emitting material may be dispersed in a matrix of another material, with or without an additive, but typically forms a layer alone. In one embodiment, each of the organic active layers 54, 56, and 58 generally has a thickness in the range of approximately 40 to 100 nm.

When the organic active layers 54, 56, and 58 are incorporated into a radiation-receiving electronic device, the material(s) of the organic active layers 54, 56, and 58 may include one or more conjugated polymers, one or more electroluminescent materials, or a combination thereof. Such materials include for example, many conjugated polymers and electro- and photo-luminescent materials. A specific example includes poly(2-methoxy,5-(2-ethyl-hexyloxy)-1,4-phenylene vinylene) ("MEH-PPV") or a MEH-PPV composite with CN-PPV. The organic active layers 54, 56, and 58 typically have a thickness in a range of approximately 50 to 500 nm.

In one embodiment, the organic active layers 54, 56, and 58 correspond to different colors used in an array. For example, for a full-color display, different materials for the organic active layers 54, 56, and 58 can be used to achieve red, green, and blue light-emitting components. In a particular embodiment, the organic active layer 54 is used in red light-emitting components, the organic active layer 56 is used in green light-emitting components, and the organic active layer 58 is used in blue light-emitting components. In another embodiment, radiation may be emitted from a charge-blocking layer, charge-injection layer, charge-transport layer, or any combination thereof in addition to, or in place of, the corresponding organic active layer. Thus, for a red light-emitting organic layer, red light may be emitted from the organic active layer 54, one or more corresponding layers adjacent to the organic active layer 54, or a combination thereof. For a green light-emitting organic layer, green light may be emitted from the organic active layer 56, one or more corresponding layers adjacent to the organic active layer 56, or a combination thereof. For a blue light-emitting organic layer, blue light may be emitted from the organic active layer 58, one or more corresponding layers adjacent to the organic active layer 58, or a combination thereof.

Electrodes 62 and conductive members 64 are formed, as illustrated in FIG. 6. The electrodes 62 are formed within openings in the substrate structures 42 and over portions of the common electrode 22 and organic layer 50. The electrodes 62 act as cathodes for the electronic device. The conductive members 64 are formed over portions of the substrate structures 42, and in one embodiment, are not electrically connected to their immediately adjacent electrodes 62 due to the negative slope of the substrate structures 42. In one embodiment, the electrodes 62 and conductive members 64 can include a metal-containing layer having a low work function, which is lower than the electrodes 22 that have a high work function. A material for the electrodes 62 and conductive members 64 can include one or more Group 1 metals (e.g., Li, Cs), one or more Group 2 (alkaline earth) metals, one or more rare earth metals, including the lanthanides and the actinides, a metal fluoride (e.g., LiF, CaF, etc.) or any combination thereof. The electrodes 62 and conductive members 64 can include a conductive capping layer that is less reactive with water and moisture compared to another layer within the electrodes 62 and conductive members 64 that lies closer to the organic layer 50. Such a capping layer can include a metal or metal alloy, such as Al, Cu, Ag, Au, Pt, Pd, other suitable metal, any alloy of such metals or any combination thereof. The electrodes 62 and conductive members 64 have a thickness in a range of approximately 300 to 600 nm. In one specific, non-limiting embodiment, a Ba layer of less than approximately 10 nm covered by an Al layer of approximately 500 nm covered by an ITO layer of approximately 100 nm may be deposited. A stencil mask corresponding to the pattern of the electrodes 62 can be used with a conventional deposition process, such as evaporation, sputtering, or the like.

At this point in the process, electronic components 128, 148, and 168 have been formed. In one embodiment, the electronic component 128 is a red light-emitting component, the electronic component 148 is a green light-emitting component, and the electronic component 168 is a blue light-emitting component. For simplicity, the substrate 20 and its electronics components will be referred to as the first workpiece, which in one embodiment is an organic panel.

4. Second Workplace Fabrication

Figure 7:
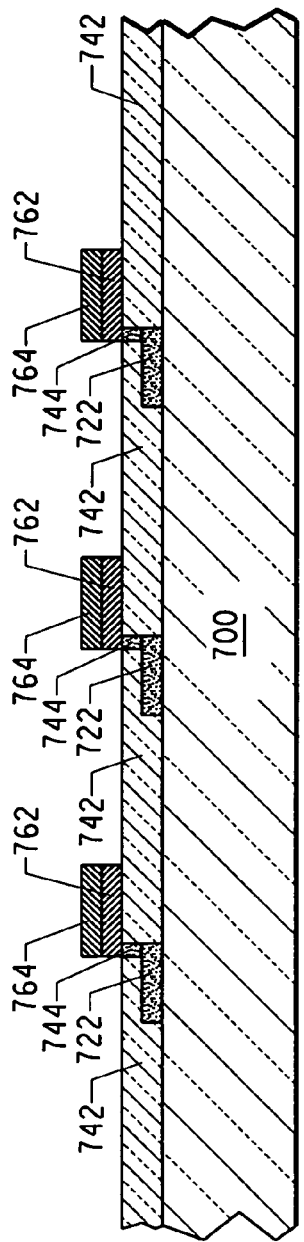
FIG. 7 includes an illustration of a cross-sectional view of a portion of another workpiece that includes control circuits and exposed conductors.

A second workpiece for the electronic device can be fabricated before or after the first workpiece. FIG. 7 illustrates a second workpiece that is a back panel, including one or more control circuits, for the electronic device. Referring to FIG. 7, a substrate 700 includes one or more materials as previously described with respect to substrate 20 of the first workpiece. In one embodiment, the substrates 20 and 700 include the same material, such as glass. In another embodiment, different materials can be used for the substrates 20 and 700. Control circuits 722 and other circuits (not illustrated) may be formed within or over the substrate 700 using conventional techniques. The other circuits (not illustrated) outside the array may include peripheral and remote circuitry used to control the pixels within the array. The focus of fabrication is on the array rather than the peripheral or remote circuitry. In one particular embodiment, the location of the control circuits 722 can be such that, when the first workpiece and second workpiece are later joined, at least a portion of the control circuits 722 underlies or overlies the substrate structures 42 of the first workpiece. In this manner, the aperture ratio is not reduced.

Insulating layer 742, which contains conductive plugs 744, is then formed using one or more of any number of conventional techniques such that each conductive plug 744 is electrically connected to a control circuit 722. In one embodiment, the insulating layer 742 is deposited as one or more patterned layer(s) using a stencil mask. In another embodiment, the insulating layer 742 is blanket deposited and patterned using a conventional lithographic technique to form openings to the control circuits 722. In one embodiment, the conductive plugs 744 are formed using a selective deposition or blanket depositing one or more layers and polishing, etching, or otherwise removing portions of such layer(s) lying outside of the openings within the insulating layer 742.

Conductors 762 and conductive members 764 are then formed using one or more of any number of conventional techniques. In some embodiments, the conductive members 764 are at a density of at least 15.5 conductive members per $cm^2$ (100 conductive members per square inch), and in other embodiments, the conductive members are at a density of at least 31.0 conductive members per $cm^2$ (200 conductive members per square inch), and in other embodiments, the conductive members are at a density of at least 46.5 conductive members per $cm^2$ (300 conductive members per square inch).

Each conductor 762 contacts one of the conductive plugs 744, and a conductive member 764 overlies its corresponding conductor 762. In one embodiment, each of the conductors 762 and conductive members 764 are deposited as one or more patterned layers using a stencil mask. In another embodiment, the conductors 762 and the conductive members 764 are formed by blanket depositing one or more layers and patterning such layer(s) using a conventional lithographic technique.

The conductors 762 are exposed to processing conditions when the substrate 700 is subsequently joined to a different substrate. In one embodiment, the conductors 762 are compatible (i.e., no adverse interactions) with a conductive material, optional adhesive, substrate structures, and exposed conductors of another substrate as described in more detail later in this specification. The conductors 762 can include at least one element selected from Groups 4 to 6, 8 and 10 to 14 of the Periodic Table, or any combination thereof. In one embodiment, the conductors 762 can include Cu, Al, Ag, Au, Mo, any alloy of such metals or any combination thereof. In another embodiment, where the conductors 762 include one layer, one of the layers can include Cu, Al, Ag, Au, Mo, any alloy of such metals or any combination thereof and another layer can include Mo, Cr, Ti, Ru, Ta, W, Si, any alloy of such metals or any combination thereof. Note that conductive metal oxide(s), conductive metal nitride(s) or a combination thereof may be used in place of or in conjunction with any of the elemental metals or alloys thereof. In one embodiment, conductors 762 have a thickness in a range of approximately 0.1 to 5 microns. In one particular embodiment, the conductors 762 can comprise ITO at the surfaces contacting the conductive members 764.

Conductive member 764 comprises a material having a melting point no greater than 240° C. In one embodiment, the conductive members 764 may comprise a low melting point metal or metal alloy. In one embodiment, the metal or metal alloy can comprise In, Sn, Bi, Pb, Hg, Ga, Cd, any alloy of such metals, or any combination thereof. In one particular embodiment, an indium-tin alloy can be used that may or may not contain Pb, Hg, Ga, Cd, or any combination thereof. In a more particular embodiment, the metallic alloy can include approximately 40 weight % In, 40 weight % Sn, and 20 weight % Pb. In one embodiment, the metal or metal alloy may have a melting point greater than 85° C. In another embodiment, the metal or metal alloy may have a melting point less than 240° C. In still another embodiment, the material has a melting point selected so as to reduce the likelihood of damage to an organic layer within the electronic device. In one embodiment, a melting point in a range of 130° C. to 200° C. may be used. For example, indium has a melting point of approximately 156° C. In another embodiment, alloys that include one or more combinations of In, Sn, or Pb may form one or more eutectic compositions having melting points in the range of 130 to 200° C. In one embodiment, conductors 762 have a thickness in a range of approximately 0.1 to 5 microns.

In one particular embodiment, the portion of the conductors 762 that contact the conductive members 764 is ITO, and the conductive members 764 are indium. The thickness of the conductors 762 and the conductive members 764 is in a range of approximately 1 to 2 microns for this embodiment. In a more particular embodiment, each of the conductors 762 can have an area, as seen from a top view, of approximately 200 microns×50 microns. When the conductive members 764 are approximately 1 micron thick, during reflow, the conductive members 764 may be able to form solder balls with a thickness of approximately 8 microns. The significance of this height will become more apparent for an embodiment where the substrate structures 42 form at least part of a stand-off.

In one embodiment, the conductors 762 and conductive members 764 can be formed during the same pump down cycle within a physical vapor deposition tool (e.g., evaporator, sputtering chamber, etc.) or a plating tool, such as one as described in U.S. Pat. No. 6,174,425. In another embodiment, the conductive members 764 can be formed during different pump down cycles, using different tools, or by using a different patterning sequence compared to that used for the conductors 762. In one embodiment, the sides of the conductors 762 and conductive members 764 are coterminous, and in another embodiment, the conductors 762 may have different shapes, as seen from a top view, as compared to their corresponding conductive members 764. For example, the conductive members 764 may be narrower, shorter, or both compared to their corresponding conductors 762.

In yet another embodiment, the conductors 762 and conductive members 764 may be formed at different times. For example, the conductors 762 may be formed, and a patterned insulating layer with openings to the conductors 762 may be formed. When forming the conductive members 764, one or more metal or metallic alloy layers that do not melt during a reflow operation may be formed and act as a barrier or an adhesion layer. Such one or more layers may be referred to as under-bump metallurgy ("UBM") that is conventional in inorganic semiconductor conductive bump technology. Another one or more layers having a melting point as previously described can be formed over the one or more metal or metallic alloy layer. Thus, conductive members 764 can include one or more layers for a UBM and one or more layers that include a material or a combination of materials that have a melting point no greater than 240° C. in one embodiment, no greater than 200° C. in another embodiment, or no greater than 160° C. in a particular embodiment.

In still another embodiment, the conductors 762, the conductive members 764, or any combination thereof can be formed using a conventional resist lift-off process. In this particular embodiment, a resist layer (not illustrated) can be formed and only have openings where the conductors 762, the conductive members 764, or any combination thereof are to remain. The one or more layers for the conductors 762, the conductive members 764, or any combination thereof are formed over the resist layer and within the openings in the resist layer. The resist layer is then removed, which also removes the layer(s) of the conductors 762, the conductive members 764, or any combination thereof that were overlying the resist layer, thus leaving portions of the conductors 762, the conductive members 764, or any combination thereof that were lying within the openings of the resist layer.

After reading this specification, skilled artisans will appreciate that many options exist regarding the composition, shape (including thickness), and formation, relative to other parts of the electronic device, of the conductive members 764. Skilled artisans can tailor the composition, shape, and formation of the conductive members 764 for their particular needs or desires.

5. Aligning the First and Second Workpieces and Reflow

Figure 8:
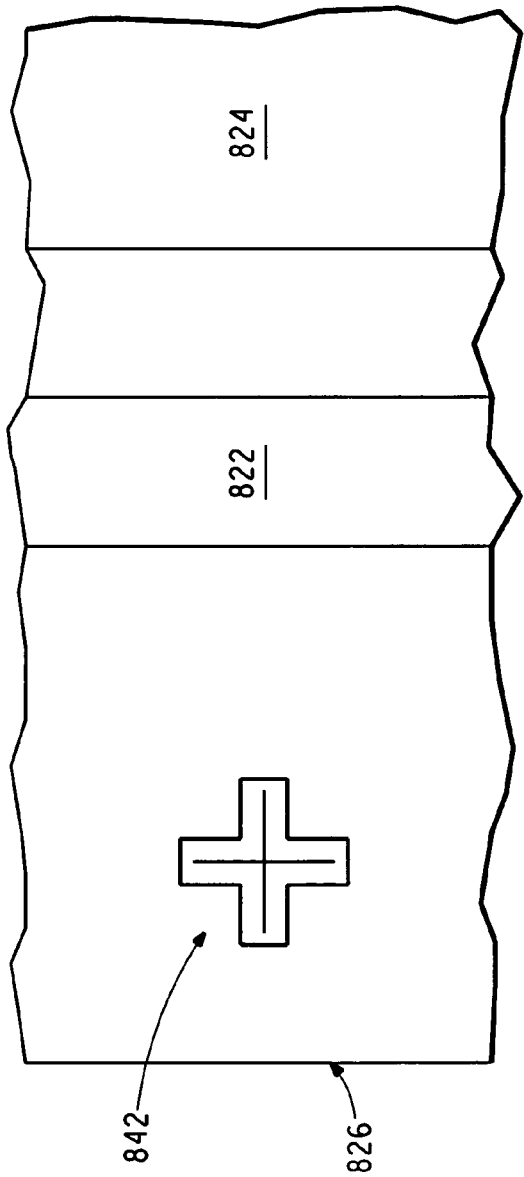
FIG. 8 includes an illustration of a top view of the workpieces of FIGS. 6 and 7 including a sealing material and alignment marks.

A sealing material 822 may be applied to the first workpiece, the second workpiece, or both, as illustrated by a top view in FIG. 8. The sealing material 822 lies between the array 824 and the edge 826 of the first workpiece, the second workpiece, or both. The sealing material 822 can include nearly any adhesive or other material used to join substrates within the electronics industry. An example of the sealing material includes epoxy, glass frit, or the like. In one embodiment, the substrates 20 and 700 and the sealing material 822 have coefficients of thermal expansion that are relatively close. For example, the lowest coefficient of thermal expansion for the three may be at least 90% of the highest coefficient of thermal expansion for the three. In one specific embodiment, the substrates 20 and 700 and the sealing material 822 include glass.

The first workpiece and the second workpiece can include complementary alignment marks 842. For example, the first workpiece can include a solid cross, and the second workpiece can include a large open cross in which the solid cross is to lie when the first and second workpieces are properly aligned. Many other types of alignment marks can be used in conjunction with or in place of the alignment marks 842. The alignment process is conventional.

Figure 9:
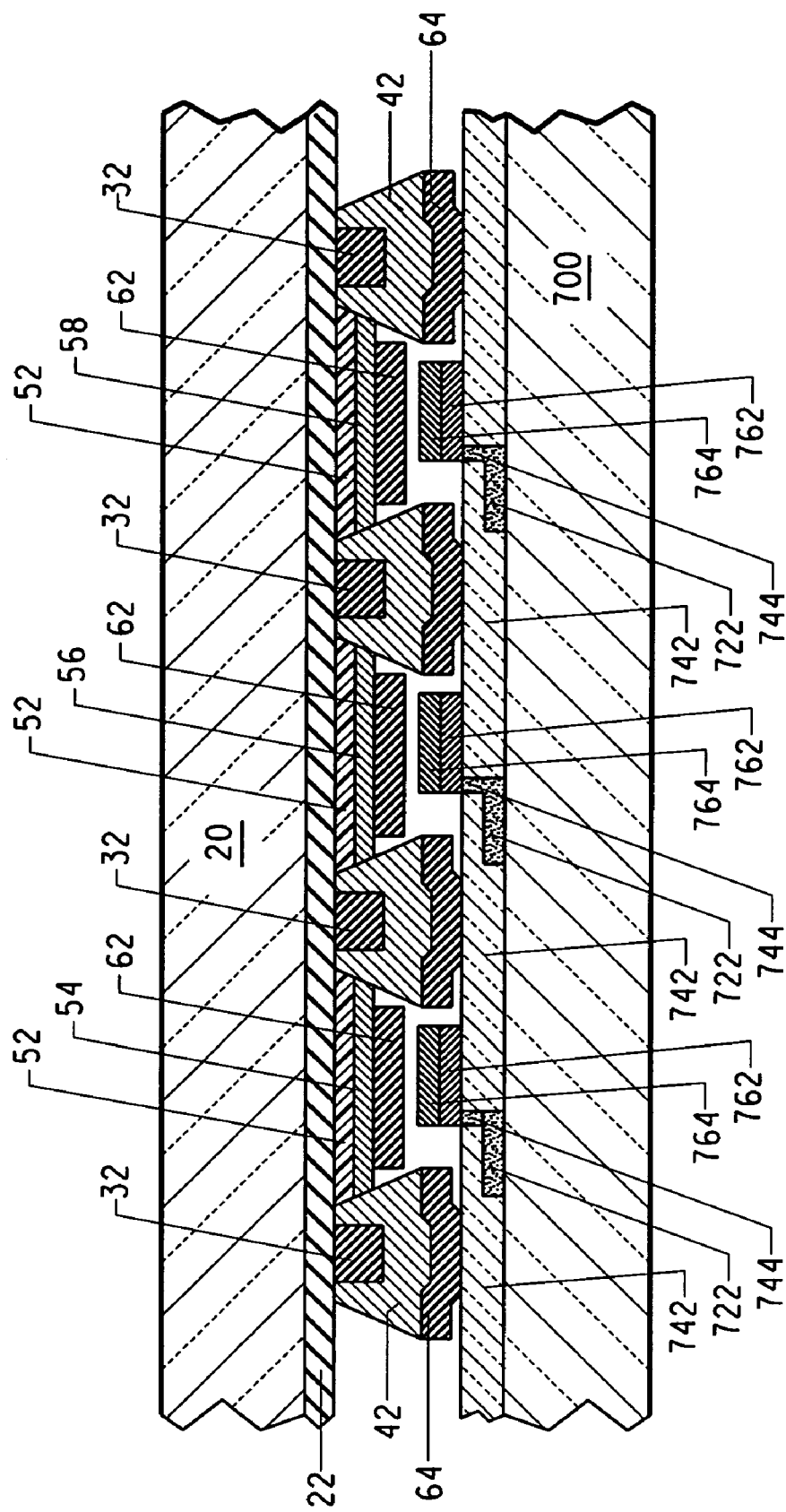
FIG. 9 includes an illustration of a cross-sectional view of the workpieces of FIGS. 6 and 7 before performing a reflow operation.

After alignment, the first workpiece and second workpiece can be pressed together and sealed by the sealing material 822. The sealing may be performed under vacuum, at atmospheric pressure or higher pressure, using a relatively inert gas (one or more noble gases, $N_2$, or any combination thereof), or any combination of pressure and gas(es). FIG. 9 includes an illustration of an embodiment in which the substrate structures 42 are part of a stand-off. A combinations of the conductive members 32, well structures 42, and the conductive members 64 of the first workpiece act as stand-offs and can help to maintain a more consistent spacing between the electrodes 62 and the conductors 762. In the embodiment as illustrated in FIG. 9, the conductive members 64 of the first workpiece contact the second workpiece. In another embodiment in which the conductive members 64 are not present (i.e., electrodes 62 are formed without forming the conductive members 64), the substrate structures 42 may contact the second workpiece. In still another embodiment, the conductive members 64, substrate structures 42, or any combination thereof does not need to contact the second workpiece. As described later in this specification, the conductive members 64, substrate structures 42, or any combination thereof is not required and may not be present over the substrate 20.

The sealing material 822 (in FIG. 8, but not illustrated in FIG. 9) is cured, heated, or otherwise exposed or treated to a chemical agent, radiation, or any combination thereof using a conventional technique. In one embodiment, the sealing material can include an epoxy that is cured with exposure to ultra-violet ("UV") radiation. In another embodiment, the sealing material 822 can include glass that can be locally heated to form a glass frit seal. After reading this specification, skilled artisans will appreciate that other sealing materials and sealing techniques can be used. The sealing material 822 reduces the likelihood that an ambient within the electronic device and an ambient outside the electronic device will intermix to any significant degree. A separate encapsulating layer is not required if the sealing material 822 is used.

At this point in the process, the conductive members 764, which is attached to the substrate 700, and their closest electrodes 62 may be spaced apart from each other by a gap. The size of the gap can vary based on a plurality of factors including the material(s) within the conductive members 764 (e.g., morphology), relative differences in surface tensions between the conductive members 764 and surfaces (of the conductors 762 and electrodes 62) they currently contact or will contact, reflow conditions, orientation of the substrates during reflow (second workpiece on the bottom, first workpiece on the bottom), other potential conditions, or any combination thereof. In one embodiment, the gap can be up to 8 microns. In a more particular embodiment, the gap can be up to 1 micron. In another embodiment, one or more of the conductive members 764 can contact one or more of the electrodes 62. Care may be exercised to keep damage to the electronic components of the first workpiece reasonably low.

A reflow operation is performed to reflow the conductive members 764, as illustrated in FIG. 9. During reflowing, the conductive members 764 flow towards the electrodes 62 of the first workpiece. If the conductive members 764 are attached to the first workpiece, during reflow, the conductive members 764 flow towards the conductors 762 of the second workpiece. A successful reflow operation results in the conductive members 764 electrically connecting their corresponding conductors 762 and electrodes 62 to each other. As will be described later in this specification, a reflow operation may not be completely successful, and a repair operation may be performed on non-functional components to complete the electrical connections.

The reflow is performed at least at a temperature in which the conductive members 764 begin to change their shape. In one embodiment, the reflow is performed at a temperature of at least a melting point. After reaching approximately a desired temperature, the reflow can occur relatively quickly, for example, in less than a minute. In another embodiment, the reflow can be performed for a longer time, if needed or desired. The reflow can be performed at nearly any temperature or combination of time and temperature, as long as the functionality or lifetime of the electronic device or any of its components is not significantly adversely affected. For example, if the organic layer 50 of the first workpiece is exposed to a temperature that is too high or a combination of temperature and time that is too high, the organic layer 50 may degrade, suffer from a reduce lifetime, decompose or otherwise react, or any combination thereof.

The reflow may be performed using one or more different heating or radiation sources. For example, the reflow can be performed by placing the first and second workpieces on a hot plate or within an oven. In another embodiment, a directional radiation source, such as a laser, can be used.

In one particular embodiment, a hot plate can be set to a temperature higher than the melting or eutectic point of the material within the conductive members 764, such as 160° C. when indium conductive members are used. The second workpiece and first workpiece can be placed over the hot plate. In a more specific embodiment, the second workpiece can lie on the heating element or heating surface of the hot plate. After the second workpiece reaches a temperature higher than approximately 156° C., the indium within the conductive members 764 can melt and allow the conductive members 764 to reflow. The reflow can take less than a minute, and in a more particular embodiment, can be performed in approximately 5 to 20 seconds. In one embodiment, using the hot plate may be better than using an oven because, with the oven, the first workpiece may be exposed to the same heat as the second workpiece, whereas with the hot plate, the first workpiece, and in particular, the organic layer of the first workpiece, may be cooler than the second workpiece. Therefore, during reflow, the hot plate can allow the averaged temperature of the organic layer within the array to be lower than the averaged temperature of the conductive members 764 within the array. However, the hot plate and the oven can have a relatively high throughput rate because all conductive members 764 may reflow during the same heating cycle.

In another particular embodiment, a directional radiation source, such as a pulsed laser, can be used. The pulsed laser can be used to provide energy sufficient to reflow the conductive members 764 with potentially less heating of the first workpiece. In one embodiment, the pulsed laser can be targeted at the conductor 762, the conductive member 764, or both and use radiation that is significantly absorbed by the conductor 762, the conductive member 764, or both. If radiation is absorbed by the conductor 762, the corresponding conductive member 764 can be heated by thermal conduction. Whether heated by radiation or thermal conduction, after the conductive member 764 reaches a temperature higher than approximately 156° C., the indium within the conductive member 764 can melt and allow the conductive member 764 to reflow. The reflow can take less than a minute, and in a more particular embodiment, can be performed in approximately 5 to 20 seconds. The actual time can depend on the radiation dose, whether the radiation source is pulsed, and if pulsed, the pulsing frequency (how long the pulse is on and off). During the reflow operation for the array, the pulsed laser can allow the averaged temperature of the organic layer within the array to increase by no more than approximately 10° C. higher than the ambient temperature where the reflow is being performed. In one more particular embodiment, the averaged temperature of the organic layer within the array increases by no more than approximately 10° C. during the reflow operation for the array.

At this point in the process, the conductive members 764 are substantially directly bonded to the conductors 762 and the electrodes 62. The direct bonding can allow the conductive members 764 to electrically connect the conductors 762 and the electrodes 62. In one embodiment, a particle, very thin film (e.g., oil from contact with one or more humans), or other contamination may lie between a portion of one of the conductive members 764 and either or both of one of the conductors 762 and one of the electrodes 62. In a particular embodiment, the substantially direct bonding can provide a mechanical bond in addition to or in place of the sealing material 822.

Other energy sources and techniques can be used. After reading this specification, skilled artisans will be able to select an energy source and technique that meets their needs or desires.

The orientation of the second workpiece and first workpiece may be reversed. In this embodiment, the second workpiece may overlie the first workpiece. In a particular embodiment, the conductors 762 have wetting, as opposed to non-wetting, surfaces with respect to the conductive members 764. Gravity may help assist in reflowing the conductive members 764.

Figure 10:
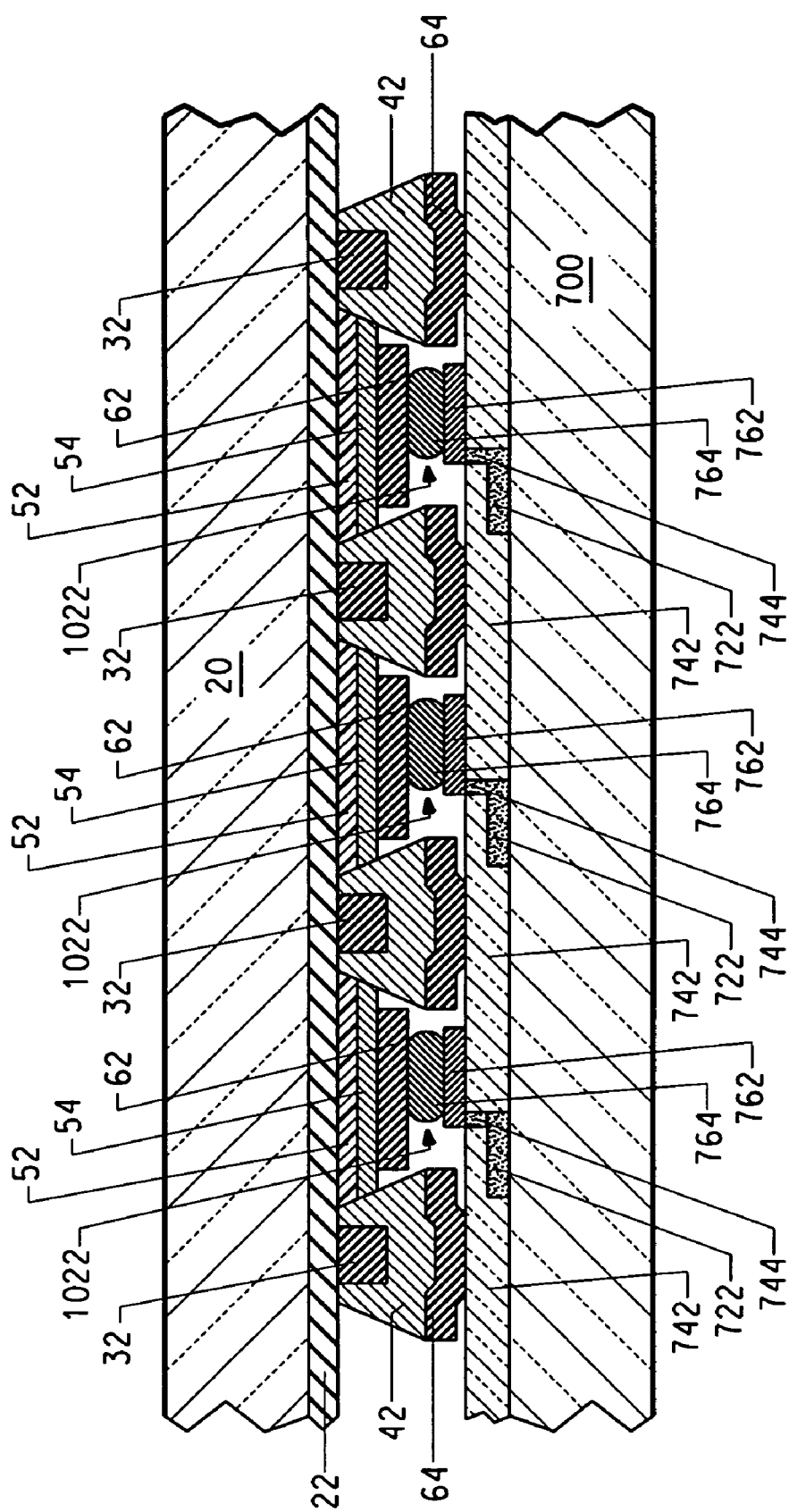
FIG. 10 includes an illustration of a cross-sectional view of the workpieces of FIG. 9 after performing a reflow operation.

FIG. 10 includes an illustration of a cross-sectional view of a portion of the electronic device in FIG. 9 after reflowing the conductive members 764. In one specific embodiment, the surfaces of the conductors 762 and electrodes 62 include ITO, and the conductive members 764 are indium. During reflow, the conductive members 764 start to "ball up" because the surface energy of ITO (the conductors 762 and electrodes 62) is lower than indium (the conductive members 764). The balling up is illustrated by rounded sides 1022 of the conductive members 764 and causes the conductive members 764 to flow towards the electrodes 62. Eventually, the conductive members 764 contact the electrodes 62 to form an electrical connection between the conductors 762 and the electrodes 62.

In one embodiment, the rounded sides 1022 are continuous (i.e., no sharp corners). The widths of the conductive members 764 at points about halfway between the electrodes 62 and conductors 762 is wider than a width of the first conductive members 764 at point adjacent to the electrodes 62 or the conductors 762. In a particular embodiment, the widths of the conductive members 764 are widest at points about halfway between the electrodes 62 and conductors 762.

The height that the first conductive members 764 can reach can depend on the surface energies of the first conductive members 764, the conductors 762 and the electrodes 62, the morphology of the first conductive members 764, conditions during reflow, or any combination thereof. In a particular embodiment, when the surface of the electrodes 62 and the conductors 762 include a surface consisting essentially of ITO and first conductive members 764 consist essentially of indium, the first conductive members 764 may reach a height of approximately 8 microns. For this particular embodiment, the distance between the electrodes 62 and the conductors 762 may be no greater than 8 microns. As the distance decreases, the likelihood of successfully reflowing the first conductive members 764 to form the electrical connections between the electrodes 62 and the conductors 762 may increase. For a specific combination of surface energies and materials, one or more empirical tests can be performed to determine a maximum reproducible height that the conductive members 764 can achieve, which in turn can be used in specifying a maximum allowable distance between the electrodes 62 and conductors 762 for that specific combination. The maximum allowable distance is typically less than the maximum reproducible height. After reflow, in one embodiment, the conductive members 764 have a height of at least 3.5 microns.

After reflow, one or more of the conductive members 764 may include one or more voids within or along the sides of the affected conductive member(s). The one or more voids are not a problem as long as the electrical connection between the conductors 762 and the electrodes 62 are made. The conductive member(s) 764 can resemble an interconnection network, if the conductive member(s) 764 would be cut halfway between the conductors 762 and electrodes 62 and examined from a top view. In one embodiment, a majority of the conductive members 764 may include one or more voids. In one specific embodiment, a single conductive member 764 may separate into a plurality of conductive members that electrically connect the electrodes 62 and the conductors 762.

The number of electrical connections within an electronic device, or even just the array within the electronic device, made using the reflow process can be numerous. In one embodiment, at least 4,000 conductors and at least 4,000 electrodes may be electrically connected with at least 4,000 conductive members. In another embodiment, at least 11,000 conductors and at least 11,000 electrodes may be electrically connected with at least 11,000 conductive members, in still a further embodiment, at least 110,000 conductors and at least 110,000 electrodes may be electrically connected with at least 110,000 conductive members, and in yet a further embodiment, at least a million conductors and at least a million electrodes may be electrically connected with at least a million conductive members. In one embodiment, the ratio of conductive members 764 to conductors 762 to electrodes 62 is 1:1:1. In another embodiment, any one or more of the numbers within the ratio may be greater than one. In a particular embodiment, the ratio is X:1:1, wherein X is a number (fractional or integer) greater than 1. For example, X can be 2, 3, 4, 5, or even higher.

In one embodiment, the reflow by itself is sufficient to successfully electrically connect the conductors 762 to their corresponding electrodes 62. However, due to the large number of electrical connections to be made, the reflow operation may not be completely successful. For example, a majority but not all of the electrical connections may be made during a reflow operation. For example, one or more of the conductive members 764 may not have flowed or only partially flowed towards their corresponding electrodes 62. Testing can be performed to determine which locations do not have an electrical connection (e.g., an electrical open) or unacceptably high resistance (e.g., conductive member 764 barely contacts the electrode 62). In another embodiment where a display is being fabricated, testing can be performed to determine which pixels or subpixels do not have a minimum emission intensity. Data from the testing can be used to target which one or more portions of the electronic device are to be repaired.

Many options exist for repairing. In one embodiment, the repairing can be repeating the reflow operation. If a hot plate was used for the reflow, it can also be used for the repair. If one area of the electronic device has more electrical opens or high resistance, that area can be positioned to be closer to the center of the hot plate. In another embodiment, reflowing and repairing can be performed using different techniques. For example, reflowing may be performed using a hot plate (due to relatively high throughput), and repairing may be performed using a directional radiation source, such as a pulsed laser.

In one particular embodiment, reflow and testing are performed. Based on the testing information, the one or more portions of the electronic device that are to be repaired can be identified. During repair, the repairing operation may be performed for such one or more portions or for such one or more portions and conductive members at neighboring locations. For example, testing may locate a non-functional region called a "dead spot." Testing may indicate that the conductive members 764 just outside the dead spot are within specification, albeit near an upper limit or a lower limit. In this particular embodiment, the conductive members within the dead spot repaired, and also, the conductive members 764 adjacent to the dead spot are also repaired, such that conductive members 764 adjacent to the dead spot may achieve test results within specification but further from the upper or lower limit. Not all conductive members 764 will be targeted for repairing in this particular embodiment. Testing and repairing may be iterated until all electrical connections between corresponding conductors 762 and electrodes 62 are made or for a set number of times. After reading this specification, skilled artisans will be able to determine the technique for repairing that meets their needs or desires.

Similar to reflowing, during repairing, the orientation of the second workpiece and first workpiece may be reversed. In this embodiment, gravity may assist in repairing the electronic device.

In one embodiment, a substantially completed electronic device is formed. In this embodiment, the sealing material 822 seals the sensitive portions of the electronic device from the ambient outside the electronic device. In this embodiment, gas laterally surrounds the conductive members 764. Even if evacuated, at least some gas still remains in the gap between the electrodes 62 and the conductors 762.

At this point in the process, the electronic device can include the first and second workpieces that are physically connected to each other by the first conductive members 764. If desired, the electronic device can be disassembled by heating the conductive members 764 to at least their melting point and separating the first and second workpieces from each other. The electronic device can be reassembled by aligning or otherwise positioning the first and second workpieces relative to each other and re-heating the conductive members 764 to at least their melting point. The process of disassembly and reassembly as described herein allows electronic devices to be realigned or otherwise reworked without significantly adversely affecting the electronic device, any portion of the electronic device including the first workpiece, the second workpiece, any component within the first workpiece or the second workpiece, the conductive members 764, or any combination thereof. Thus, in one embodiment, the conductive members 764 can allow the electronic device to be reversibly disassembled, reversibly reassembled, or a combination thereof.

If a paste, epoxy, or other adhesive material would be used, disassembly may result in delamination of or other significant damage to one or more conductors 762, one or more electrodes 62, or other one or more layers that may adhere to the paste, epoxy, or other adhesive material. In addition, wherein the cured paste, epoxy, or other adhesive material could fracture or otherwise break during separation of the workpieces, particles can be generated and interfere with or prevent electrical connections made during a subsequent reassembly. Further, the same paste, epoxy, or other adhesive material already on the first workpiece (including the electrodes 62), the second workpiece (including the conductors 762) or any combination thereof cannot be reused after curing. Therefore, new paste, epoxy, or other adhesive may need to be used.

Figure 11:
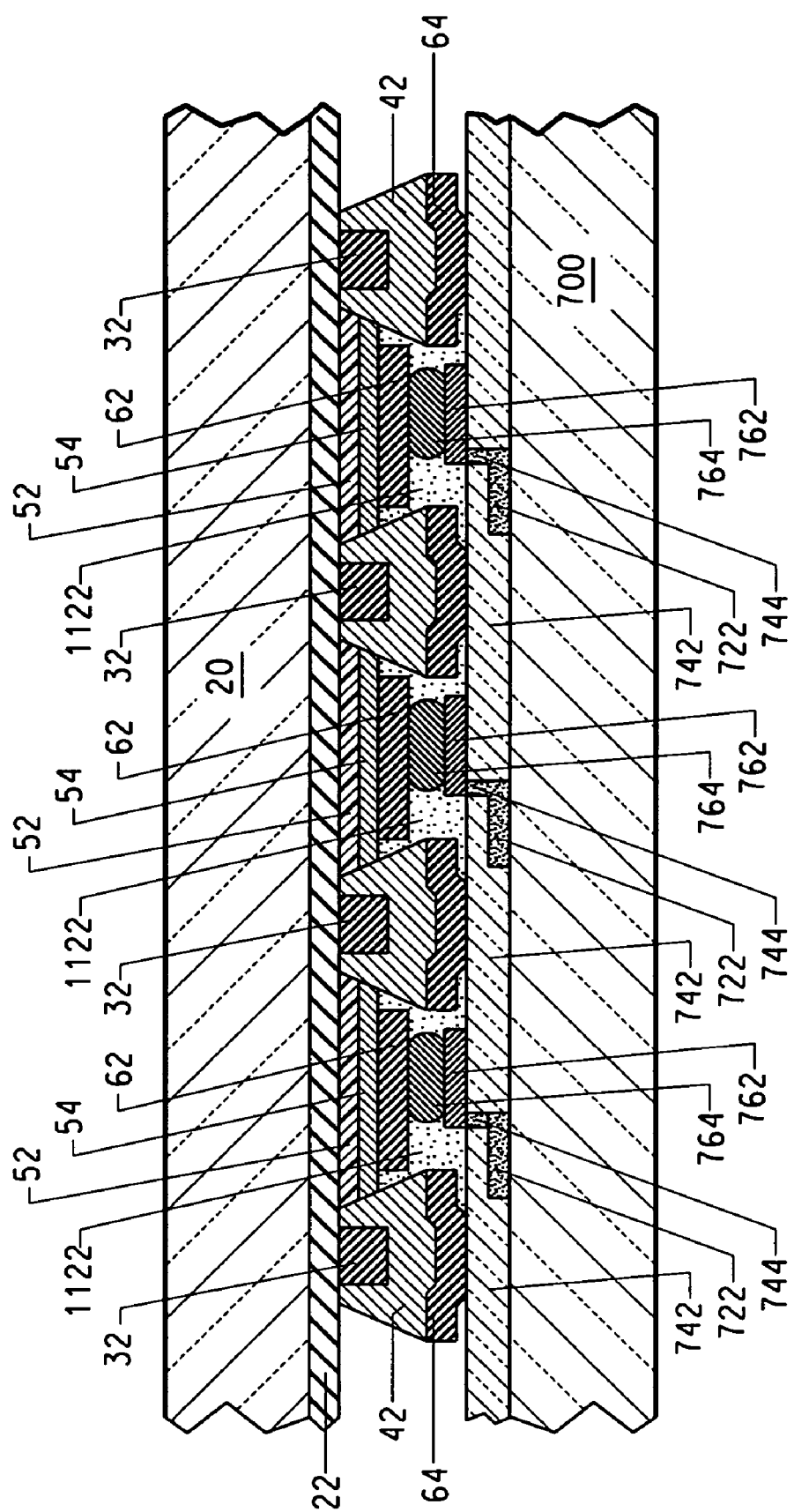
FIG. 11 includes an illustration of a cross-sectional view of the workpieces of FIGS. 6 and 7 after performing a reflow operation and forming an encapsulating layer.

As illustrated in FIGS. 10 and 11, the electronic device can include an AMOLED display, wherein radiation can be emitted through the common electrode 22 and the first workpiece. In a particular embodiment, the aperture ratio can exceed 70%, 80%, 90%, or even higher. In one embodiment, radiation can also be emitted through the substrate 700. A relatively high aperture ratio can be achieved because the control circuits of the second workpiece do not lie between the user side of the electronic device and the electronic components 128, 148, and 168.

6. Electronic Device and its Operation

The electronic device may be used by itself or may be incorporated into a system. For example, the electronic device can be a display that can be incorporated into a monitor for a computer, a television, or a display in a mobile communicating device, or the like.

The electronic device can be operated by providing the proper signals and data to the terminals as illustrated in FIG. 1. Data signal can be placed on the DLs 132, 152, and 172 when the SL 134 is activated, which in turn allows current to flow through the electronic components 128, 148, and 168. The reflowed conductive members 764 provide the electrical connections between the electronic components 128, 148, and 168 to their respective power transistors 126.

When other types of electronic devices are formed (e.g., a sensor array), the circuitry and the voltages or other signals may change accordingly.

7. Alternative Embodiments

In an alternative embodiment, the electronic device can include other types of display devices, such as a passive matrix display, a static image display, or any combination thereof. In another embodiment, the electronic components can include radiation-responsive components in conjunction with or in place of the radiation-emitting components. Such radiation-responsive components can include radiation sensors, photovoltaic cells, or other similar electronic components that respond to radiation received by an organic active layer.

In still another embodiment, the conductive members 764 could be formed over the first workpiece rather than the second workpiece. One exemplary, non-limiting process is described and illustrated with respect to FIGS. 12 to 19. In one particular embodiment, the substrate structure 42 includes an organic material. The starting point in the process is the first workpiece as illustrated in FIG. 5.

Figure 12:
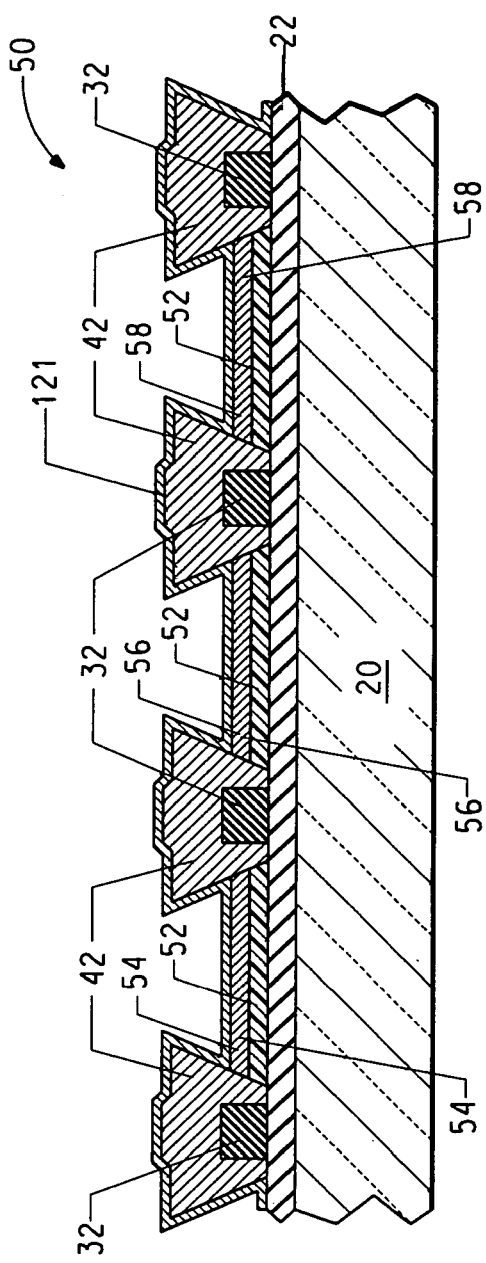
FIG. 12 includes an illustration of a cross-sectional view of the workpiece of FIG. 5 after formation of a protective layer.

A protective layer 121 is formed over the substrate 20, including the well structures 42 and the organic layer 50, as illustrated in FIG. 12. The protective layer 121 will be used to protect sidewalls of the well structures during a subsequent resist removal process. The protective layer 121 can include an inorganic material, such as a nitride, an oxide, or an oxynitride. In one embodiment, the protective layer 121 can be conformally deposited using a conventional plasma deposition technique. In another embodiment, the protective layer 121 is not conformal, but still is deposited to form a continuous layer over exposed surfaces of the well structures 42 and organic layer 50. The protective layer 121 has a thickness in a range of 5 to 30 nm, as measured on a substantially flat surface.

An anisotropic etch can be performed to remove portions of the protective layer 121 that would be seen from a top view of the first workpiece. In one embodiment, the anisotropic etch can be performed using dry etching using one or more steps. The conditions of the dry etch process need not remain uniform throughout the operation of the dry etching. Rather, gas mixtures, gas pressures, voltage, power density, and temperature may vary over time during dry etching. The dry etching process may include discrete steps having well-defined starting and stopping points or may include various steps within one continuous operation having only one initial starting point and one stopping point only upon completion of dry etch task. Use of the "step" or "steps" is meant to include both those uses having discrete starts and stops and a single dry etch process where conditions are varied at least once during one continuous operation.

In one particular embodiment described herein, the dry etch is performed as a single step due to its relatively thin thickness. At least one halogen-containing gas can be used. The halogen-containing gas can include any one or more of a fluorine-containing gas, a chlorine-containing gas, a bromine-containing gas, or an iodine-containing gas and mixtures thereof.

When a fluorine-containing gas is used, it may include any one or more fluorocarbon gases, which may or may not be saturated and may or may not include other halogen atoms, $F_2$, HF, $SF_6$, $NF_3$, fluorine-containing interhalogens (ClF, $ClF_3$, $ClF_5$, $BrF_3$, $BrF_5$, and $IF_5$), and mixtures thereof. A chlorine-containing gas may be selected from a group consisting of chlorocarbons that may or may not be saturated and may or may not include other halogen atoms (e.g., F, Br, and I), $Cl_2$, HCl, $BCl_3$, chlorine-containing interhalogens (ClF, $ClF_3$, and $ClF_5$), and mixtures thereof. A bromine-containing gas may be selected from a group consisting of bromocarbons that may or may not be saturated and may or may not include other halogen atoms (e.g., F, Cl, and I), $Br_2$, HBr, $BBr_3$, bromine-containing interhalogens ($BrF_3$ and $BrF_5$), and mixtures thereof. An iodine-containing gas may be selected from a group consisting of iodocarbons which may or may not be saturated and may or may not include other halogen atoms (e.g., F, Cl, and Br), $I_2$, HI, metal iodides, iodine-containing interhalogens ($IF_5$), and mixtures thereof.

In one embodiment, the halogen-containing gas may be a fluorine-containing gas. In another embodiment, the fluorine-containing gas may include a fluorocarbon that may or may not be saturated and may or may not include other halogen atoms. In still another embodiment, the fluorocarbon may have a formula $C_aF_bH_c$, wherein a is 1 or 2, b is at least 1, and b+c is 4 if a is 1 and is 4 or 6 if a is 2. The presence of hydrogen within the plasma can help to passivate a sidewall surface, and improve the anisotropic character of the etch. In one particular embodiment, $CHF_3$ is an exemplary fluorocarbon gas.

In one embodiment, an oxygen-containing gas is not used. The oxygen-containing gas can etch organic materials. In a particular embodiment, the substrate structures 42 and organic layer 50 are not or only minimally etched. An inert or a reducing gas may be used. The inert gas may include any one or more of a noble gas, $N_2$, and mixtures thereof, and the reducing gas may include any one or more of $H_2$, $NH_3$, $N_2H_4$, $N_2H_2$, and mixtures thereof. The inert gas can be used to physically remove non-volatile etch products or other materials. In one particular embodiment, the inert gas is not used to improve the etch selectivity between the protective layer 121 and the organic layer 50. A hydrogen gas may be added to help passivate the protective layer 121 lying along the sides of the substrate structures 42.

Figure 13:
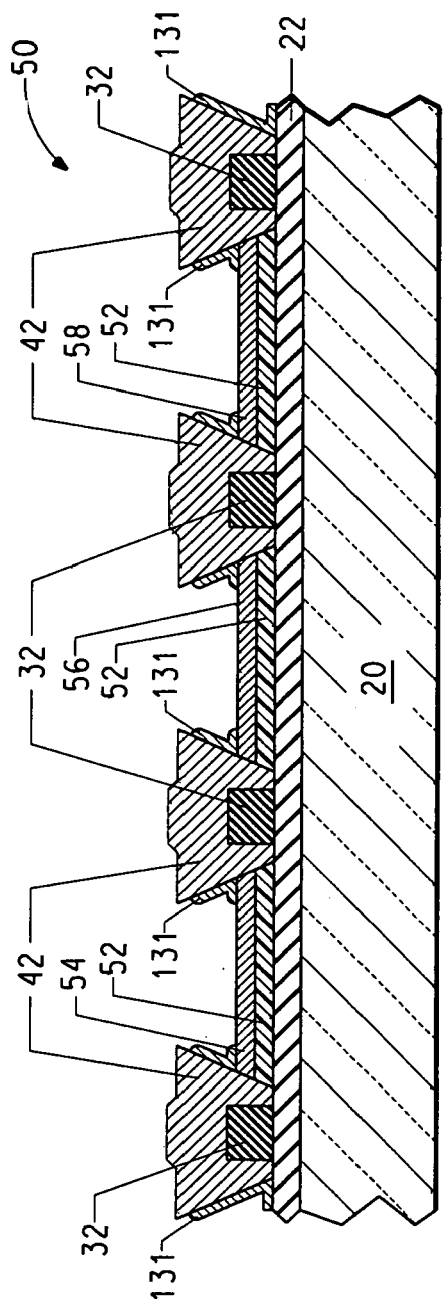
FIG. 13 includes an illustration of a cross-sectional view of the workpiece of FIG. 12 after performing an etch operation.

The dry etching may be performed at a power density in a range of approximately 10 to 5000 mW/cm² and at a pressure in a range of approximately 0.01 to 5000 mTorr. The temperature can vary, depending on the performance sensitive element and the organic material to be removed. The dry etch is typically performed at a temperature not above about 80° C. The dry etching can be performed as a timed etch or using endpoint detection (when the substrate structures 42, organic layer 50, or both) are reached with a timed overetch. At this point in the process, protective structures 131 are formed adjacent to sides of the substrate structures 42 and portions of the organic layer 50, as illustrated in FIG. 13.

Figure 14:
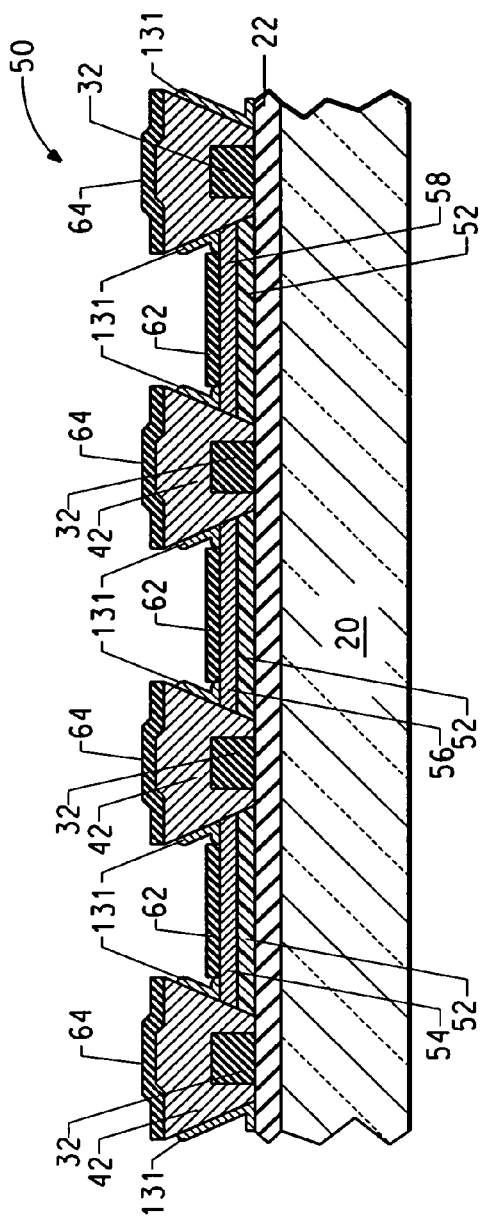
FIG. 14 includes an illustration of a cross-sectional view of the workpiece of FIG. 13 after forming electrodes and other conductive members.

The electrodes 62 and conductive members 64 are formed, as illustrated in FIG. 14. The materials and formation of the electrodes 62 and conductive members 64 can be performed using any one or more embodiments described previously when forming the electrodes 62 and conductive members 64, as illustrated in FIG. 6.

Figure 15:
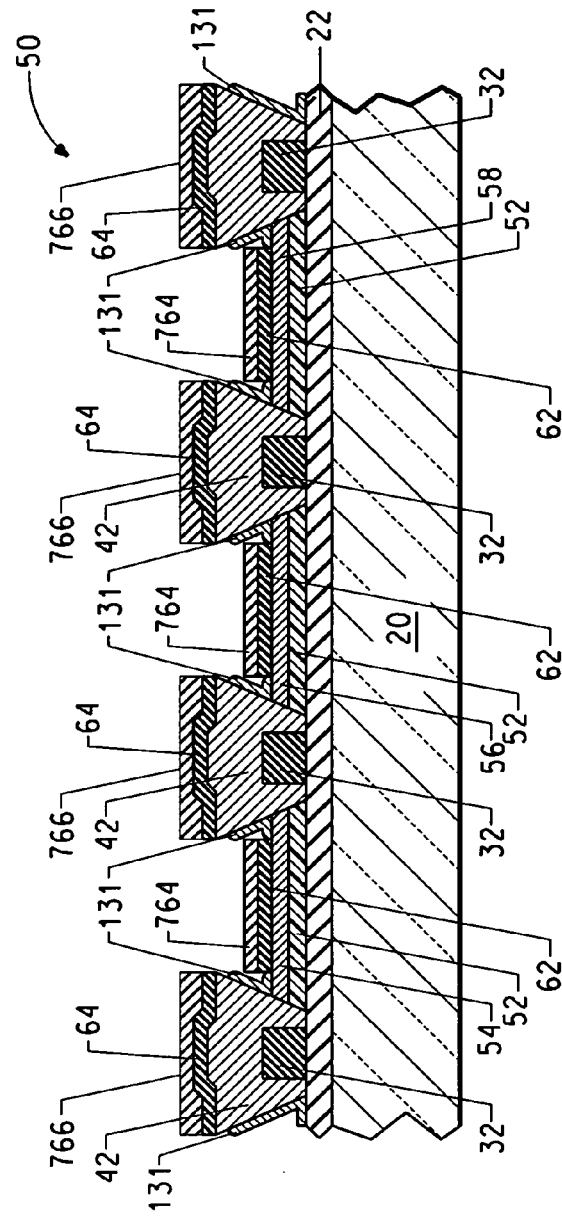
FIG. 15 includes an illustration of a cross-sectional view of the workpiece of FIG. 14 after forming additional conductive members.

The conductive members 764 and 766 are formed over the electrodes 62 and conductive members 64, as illustrated in FIG. 15. The materials and formation of the conductive members 764 and 766 can be performed using any one or more embodiments described previously when forming the conductive members 764, as illustrated in FIG. 7. The tops of the conductive members 764 may or may not contact the conductive members 64 or the conductive members 766. As will be explained later, such contact is not problematic.

Figure 16:
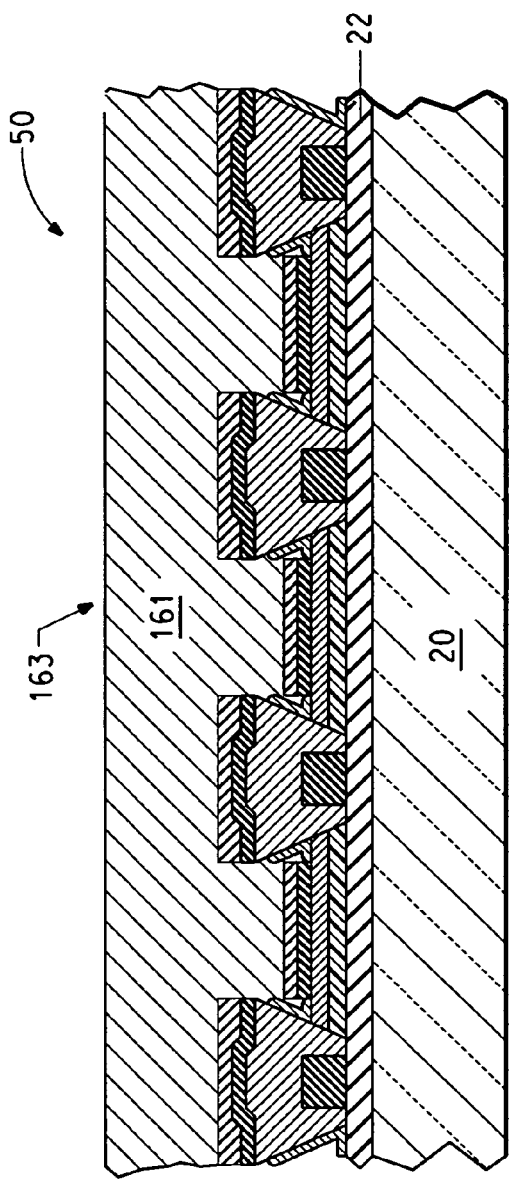
FIG. 16 includes an illustration of a cross-sectional view of the workpiece of FIG. 15 after forming an etch-back layer.

An etch-back layer 161 is formed over the substrate 20, as illustrated in FIG. 16. The etch-back layer 161 is deposited and can include an organic or inorganic material. In one embodiment, the etch-back layer 161 includes a substantially planar surface 163 that may or may not be substantially parallel to the primary surface of the substrate 20. In one particular embodiment, an organic resist material can be spin-coated over the substrate 20.

Figure 17:
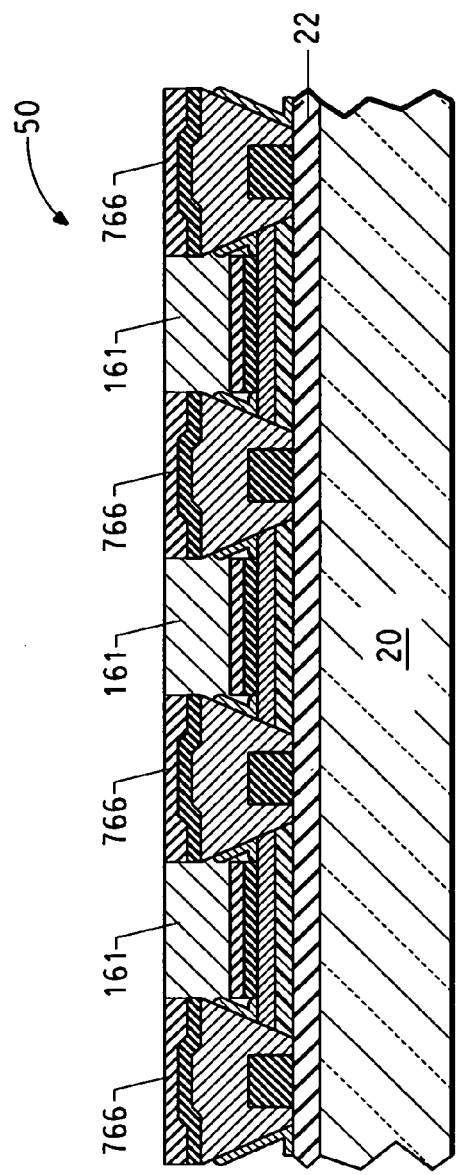
FIG. 17 includes an illustration of a cross-sectional view of the workpiece of FIG. 16 after exposing conductive members that overlie the substrate structures.

The etch-back layer 161 is etched to expose the conductive members 766 that overlie the substrate structures 42, as illustrated in FIG. 17. The etch may be performed isotropically or anisotropically. In one embodiment, the etch can be performed using dry etching using one or more steps. The conditions of the dry etch process need not remain uniform throughout the operation of the dry etching. Rather, gas mixtures, gas pressures, voltage, power density, and temperature may vary over time during dry etching. The dry etching process may include discrete steps having well-defined starting and stopping points or may include various steps within one continuous operation having only one initial starting point and one stopping point only upon completion of dry etch task. Use of the "step" or "steps" is meant to include both those uses having discrete starts and stops and a single dry etch process where conditions are varied at least once during one continuous operation.

In one particular embodiment, described herein, the dry etch is performed as two steps. A first step can be used to remove most the etch-back layer 161 without regard to selectivity to other layers lying below the etch-back layer. The first step can use an oxygen-containing gas. An example of an oxygen-containing gas includes $O_2$, $COF_2$, CO, $O_3$, NO, $N_2O$, or any mixtures thereof. One or more halogen-containing gases, one or more inert gases, one or more reducing gases, or any mixture thereof, as previously described, may be used in addition to the oxygen-containing gas. The etching may be performed at any of the etching conditions (e.g., power density, pressure, temperature, etc.) previously described. The first step may be performed as a timed etch or using endpoint detection (e.g., when the conductive members 766 are reached).

During a second step, the etching parameters, such as gases and power density in particular, can be changed to improve the selectivity between the etch-back layer 161 and the conductive members 766. In one embodiment, the halogen-containing gas, if any, and the inert gas, if any, or a combination thereof may be decreased or turned off in order to improve selectivity. Also, the power density can be decreased to reduce the physical component of the etch.

Figure 18:
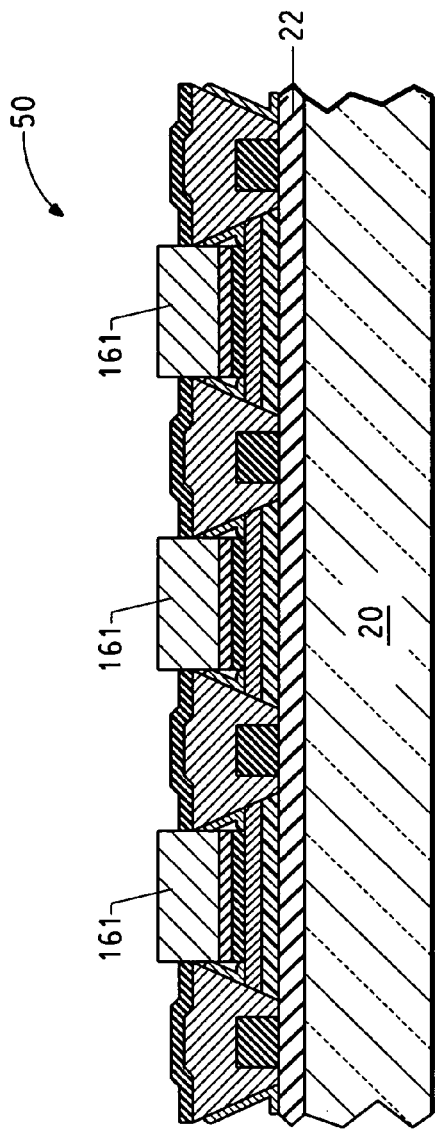
FIG. 18 includes an illustration of a cross-sectional view of the workpiece of FIG. 17 after removing exposed conductive members.

The conductive members 766 are removed, as illustrated in FIG. 18. The removal may be performed as a wet etch or dry etch process. The chemistry used for the etch can depend on the material of the conductive members 766. In one embodiment, the conductive members 766 consist essentially of indium.

A wet etch can be performed using an alcohol (e.g., methanol, ethanol, propanol, or any combination thereof), Aqua Regia (approximately 3:1 $HCl:HNO_3$), or $H_3PO_4$. The etching solution may be at approximately room temperature (in a range of approximately 20 to 25° C. or an another temperature above or below room temperature. In one particular embodiment, the wet etch is performed using $H_3PO_4$ at a temperature in a range of approximately 30 to 40° C. The wet etch may be performed as a timed etch.

In another embodiment, a dry etch may be performed using three steps. The first step can be a "break-thru" etch used to etch through any oxide or contaminant that may have formed on the surface of the conductive members 766, the second step can be used for most of the etching of the conductive members 766, and the third step can have improved selectivity to one or more layer within the conductive members 64. The etching parameters (gases and conditions) have been previously described.

The first step can include a halogen-containing gas and an inert gas. Because the conductive members 766 include at least one metal, the halogen-containing gas can include a chlorine-containing gas, a bromine-containing gas, an iodine-containing gas, or a combination thereof. The actual halogen-containing gas selected allows for the formation of one or more volatile products during the etch. The inert gas can help to physically remove the oxide or other non-volatile contaminants at the surface of the conductive members 766. The second step may be performed at the same or different conditions as the first step. In one embodiment, the inert gas may be reduced or eliminated to improve the etch rate and selectivity to the etch-back layer 161. The second step may be performed as a timed etch or until an endpoint is detected (conductive members 64 are reached. The third step may include the same or different etch chemistry as used for the second step. The third step may be performed at a lower power density as compared to the first step, the second step, or both. The third step may be performed as a timed etch or using endpoint detection and a timed overetch.

An optional fourth step can include exposing the conductive members 64 to a fluorine-containing plasma to passivate or otherwise protect the exposed surface of the conductive members 64 from ambient moisture, other contaminant, or any combination thereof, change the surface energy of the conductive members 64, or a combination thereof.

After the conductive members 766 have been removed, substantially none or only some of the conductive members 64 are removed in this embodiment. If the conductive members 766 and 64 include indium, some of the indium (e.g., ITO) may be removed with the conductive members 766. If the conductive members 64 include a layer of aluminum, silver, or other element other than indium, the etch to remove conductive members 766 may stop on or within such layer of the conductive members 64. In this manner, the remaining portions of the conductive members 64 can protect the substrate structures 42 when the etch-back layer 161 is removed.

Figure 19:
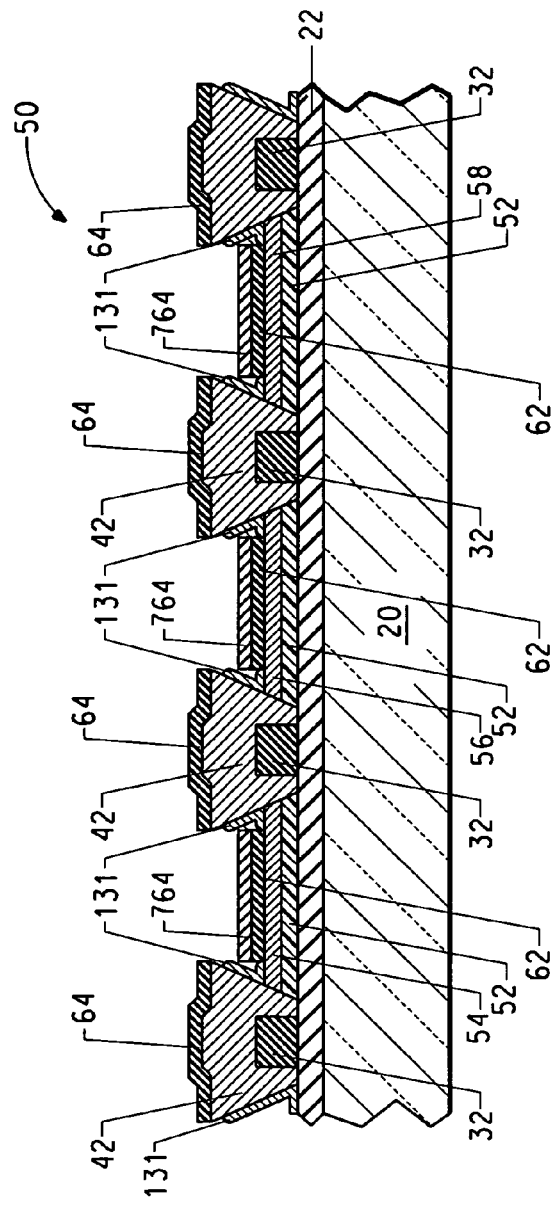
FIG. 19 includes an illustration of a cross-sectional view of the workpiece of FIG. 18 after removing the remaining portions of the etch-back layer.

At this point in the process, the remaining portions of the etch-back layer 161 are removed, as illustrated in FIG. 19. In one embodiment, the etch-back layer 161 includes an organic layer that that be removed using a conventional wet or dry resist etching process. In a particular embodiment, an organic solvent can be used to remove the etch-back layer 161 without significantly etching the conductive members 64, protective structures 131, or conductive members 764 that overlie the electrodes 62. In another embodiment, a conventional ashing technique, as used in the inorganic semiconductor arts, may be performed. The conductive members 64, protective structures 131, and conductive members 764 that overlie the electrodes 62 help to protect the substrate structures 42 and organic layer 50 when removing the etch-back layer 161 when the etch-back layer 161 includes an organic material.

In another embodiment (not illustrated), the protective structures 131 are not required if the etch-back layer 161 has a different composition compared to the other exposed layers. For example, if the etch-back layer 161 includes one or more layers of silicon oxide, nitride, oxynitride, or a combination thereof, the etch-back layer 161 may be etched using at least a fluorine-containing gas. Many fluorine-containing gases allow the layer(s) of silicon oxide, nitride, oxynitride, or a combination thereof to be etched selectively to many metals and organic materials.

The other workpiece, including substrate 700 and conductors 762, is fabricated as previously described. The conductive members 764 may or may not be present over the conductors 762. In one particular embodiment, the conductors 762 are exposed. After the workpieces are placed near each other and aligned, a reflow operation can be performed using any one or more of reflow parameters as previously described. In one embodiment, during reflowing, the conductive members 764 flow towards the workpiece with the conductors 762. At least some of the conductive members 764 are substantially directly bonded to the electrodes 62 and conductors 762. If needed or desired, testing and repairing operations can be performed as previously described.

As previously mentioned, some incidental contact between the conductive members 764 over the electrodes 62 and either or both of the conductive members 64 and conductive members 766 over the well structures, before reflowing, may not be problematic. The contact between the conductive members 764 and 766 can be substantially eliminated when the conductive members 766 are removed. The conductive members 764 may ball up as previously described because of surface energies. The balling up may help to pull the conductive members 764 away from the conductive members 64 during the reflow. Thus, any lateral contact between the conductive members 764 and conductive members 64 may be substantially eliminated by the end of the reflow operation. In this manner, adjacent electrodes 62 are not electrically shorted and do not have leakage paths (for electrical current).

If any incidental contact between conductive members 764 and conductive members 64 needs or is desired to be eliminated, an etch can be performed after the etch-back layer 161 is removed. In one particular embodiment, an isotropic etch can be used to remove a filament or other residual portion of the conductive member 764 that contacts the conductive member 64.

In an alternative embodiment to the embodiment as illustrated in FIGS. 12 to 19, a selective deposition of the electrodes 62, the conductive members 764, or any combination thereof can be performed. For example, a stencil mask may have openings that correspond to locations wherein the electrodes 62, the conductive members 764, or any combination thereof are to be formed. One or more depositions may be performed using the stencil mask to form electrodes 62, the conductive members 764, or any combination thereof. In this particular embodiment, the conductive members 64 and 766 would not be formed. Therefore, the protective layer 131 and etch-back layer 161 are not required, thus, providing a process flow with less processing operations.

In still another embodiment, the substrate structures 42 are not required. In one particular embodiment, the organic layer 50 may include one or more small-molecule organic materials that can be deposited using a stencil mask. In another particular embodiment, the electrodes 62 may also be deposited using a stencil mask. Therefore, use of the substrate structures 42 may be optional.

In another embodiment, the sealing material 822 may not be present while the reflow operation is performed. A jig or other apparatus may hold the second workpiece and first workpiece in alignment while the reflow operation is performed. After reflowing, and potentially repairing, an encapsulating layer 1122 can be formed, as illustrated in FIG. 11, in the gaps and other openings near the conductive members 764, conductors 762, and electrodes 62.

In still another embodiment, an epoxy or other suitable encapsulating material can be injected between the second workpiece and the first workpiece and cured, if needed or desired. For example, a UV curable epoxy can be injected and cured using UV radiation. If desired, the sealing material 822 can be formed outside of the encapsulating layer 1122 to potentially increase the resistance of the electronic device to contaminants.

Other physical configurations can be used. The common electrode can be replaced by a plurality of electrodes, such as anodes (e.g., rows or columns of anodes, one electrode for each pixel or subpixel, or the like). The orientation of the electrodes within the electronic device may be reversed. The electrodes that are anodes may lie closer to or be electrically connected with the conductors 762 as compared to a common electrode that is a common cathode or electrodes that are cathodes. The electrical connections made by the conductive members 764 can be made to the one type of electrodes (e.g. anodes) that lie further from the conductors 762 than the other type of electrodes (e.g., cathodes). One or more additional insulating layers, one or more patterning sequences, or a combination thereof may be used to allow the electrical connections without unintentionally forming an electrical short or leakage path to an electrode that lies in-between.

Optional surface treatments for the electrodes 62, the conductors 762, or any combination thereof may be performed to achieve desired wetting characteristics. For example, a fluorine plasma can be used to reduce the surface energy before forming or reflowing the conductive members 764. In another embodiment, relatively higher surface tension at the surfaces of the electrodes 62, the conductors 762, or any combination thereof may be desired. The composition of the electrodes 62, the conductors 762, the conductive members 764, or any combination thereof can be changed. Alternatively, a surface treatment can be used. In this embodiment, the conductive members 764 may spread out to cover the surface(s) of the electrodes 62, the conductors 762, or any combination thereof. In this embodiment, the second workpiece may overlie the first workpiece during reflow, repair, or both. The rounded sides 1022 may have an opposite orientation; the sides may be continuous, and the conductive member 764 may be the narrowest at a point between the electrodes 62 and the conductors 762.

More complicated control circuits with additional electronic components (as compared to the control circuits illustrated in FIG. 1) can be used. Such additional electronic components can be used to correct for threshold voltage shifts that may occur with the power transistors 126. Radiation transmission area may not be lost because such additional electronic components can be placed over or under the substrate structures. Thus, the lifetime may increase, and the display quality may be more stable over time.

8. Advantages

The different embodiments may have various advantages. Note that each advantage may occur with one or more but not all of the embodiments. Therefore, none of the advantages are to be construed as essential or critical to the present invention.

In one embodiment, a gap may exist between the conductive members and the electrodes or the conductors before the reflow operation is performed. The gap can help to reduce the damage to portions of the electronic device. For example, in one embodiment, gaps between the conductive members 764 and the electrodes 62 help to reduce damage to the electronic components 128, 148, and 168 when aligning or contacting the second workpiece and first workpiece to each other. In one particular embodiment, the size of the gap can be controlled by adjusting the height of the substrate structures 42 or a combination of the substrate structures 42 and any layers underlying or overlying the substrate structures 42 before contacting the second workpiece.

In another embodiment, the conductive members 764 can be reflowed by using thermal conduction or radiation without causing significant adverse damage to an organic layer within the electronic device. A variety of materials can be used to achieve a melting point for the conductive members so that they do not flow at too low of a temperature (that may occur during using or testing of the electronic device) or too high of a temperature. Such flexibility can also extend to avoid one or more materials that may be deemed relatively more hazardous (e.g., lead). In one particular embodiment, the conductive members 764 can include a metallic alloy that has a eutectic composition having a melting point lower than the melting point of any metal element within such metallic alloy.

In still another embodiment, the second workpiece and the first workpiece can be mechanically bonded together before the reflow operation is used. In this embodiment, the electrical connections made after reflowing (via the conductive members) may not be subject to as much external stress as compared to an embodiment where the reflowed electrical connections are the principal mechanical connections. In one particular embodiment, the mechanical bonding of the second workpiece and first workpiece occurs with the sealing material 822. External forces on the joined panels may be at least partially absorbed or resisted by the sealing material 822. The stress on the conductive members 764 after reflowing may be significantly lower as compared to having only the conductive members 764 hold the panels together.

In yet another embodiment, repairing can be performed without disassembling and reassembling or re-fabricating at least a portion of the electronic device. The repairing allows a high number of reflowed electrical connections to be used without having to necessarily reject the entire electronic device because the reflow operation did not reflow one or more of the conductive members. Repairing can be performed to help make electrical connections that were not or just barely made. In one particular embodiment, testing may be performed to identify portions of the electronic device that have electrical opens or resistances that are too high (collectively, "non-functional" portions or circuits). The information from testing can be used to target where the repairing operation should be performed.

9. EXAMPLES

The invention will be further described in the following examples, which do not limit the scope of the invention described in the claims.

Example 1

Example 1 demonstrates that electrical connections between substrates can be formed using a reflow process. A two-substrate backlight is formed in this example.

Figure 20:
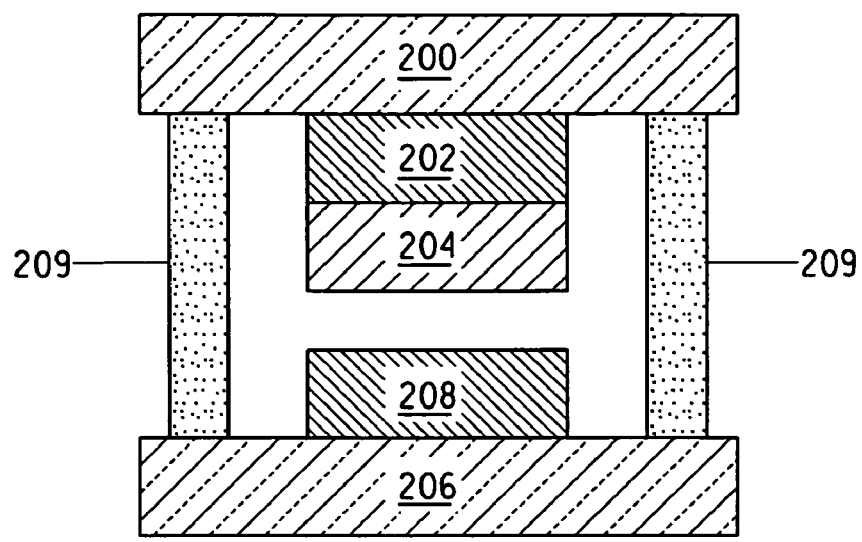
FIG. 20 includes an illustration of a cross-sectional view of exemplary workpieces, before performing a reflow operation.
Figure 21:
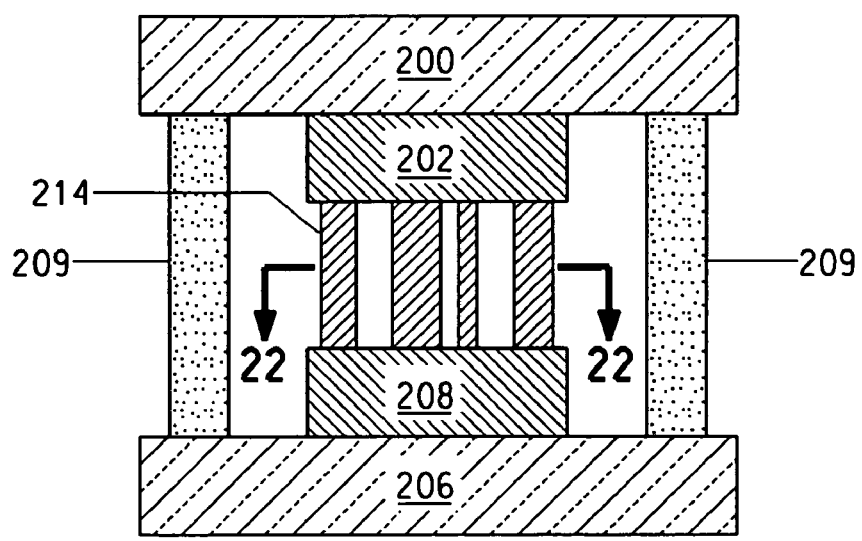
FIG. 21 includes an illustration of a cross-sectional view of the exemplary workpieces of FIG. 20, after performing a reflow operation.
Figure 22:
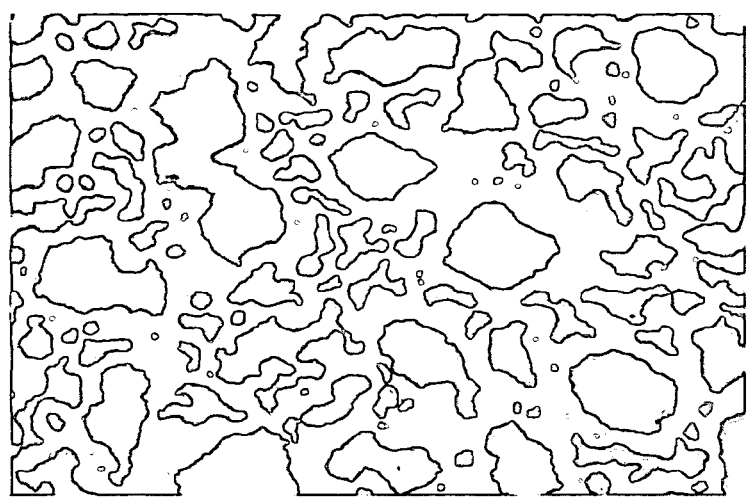
FIG. 22 includes an illustration of a top view of a portion of the workpiece of FIG. 21 after cutting through a reflowed electrical connection.

Referring to FIG. 20, a first substrate 200 is glass with a layer 202 of ITO having a thickness of approximately 110 nm. A layer 204 of indium is thermally deposited (e.g. evaporating) on the surface of the ITO in a vacuum of approximately $1 \times 10^{-6}$ Torr. The thickness of the indium layer is approximately 650 nm. After the indium layer is deposited, the first substrate 200 and another substrate 206, with a light-emitting organic layer (not illustrated) and a layer 208 of ITO (similar to the first substrate 200) but without the indium layer, are bonded together by a heat curable epoxy 209. An illustration of a cross-sectional view of the bonded substrates is illustrated in FIG. 20. The resistance between the two layers 202 and 208 at this point in the process is extremely high due to the gap between the indium layer 204 (attached to the first substrate 200) and the ITO layer 208 of the second substrate 206. Thus, no electrical connection has been made between the ITO layers 202 and 208 of the substrates. The bonded substrates are heated to approximately 160° C. on a hot plate set at a temperature of 160° C. When the temperature of the substrates reaches approximately 160° C., the indium melts. The metal reflowing process can take less than 5 seconds at approximately 160° C. to complete. After the reflowing process, the resistance between the two ITO layers 202 and 208 of the two substrates is approximately 15Ω, indicating that an electrical connection 214 is made, as illustrated in FIG. 21. FIG. 22 includes an illustration of a top view of the reflowed indium of the electrical connection 214 at the sectioning line 22-22 in FIG. 21. Voids 222 are formed within the electrical connection 214. After reflowing, the electrical connection 214 becomes an interconnecting network 224 of indium between the voids 222.

Example 2

Example 2 demonstrates that conductive members of indium can be formed that pull away from edges of ITO layers during a reflow process.

Figure 23:
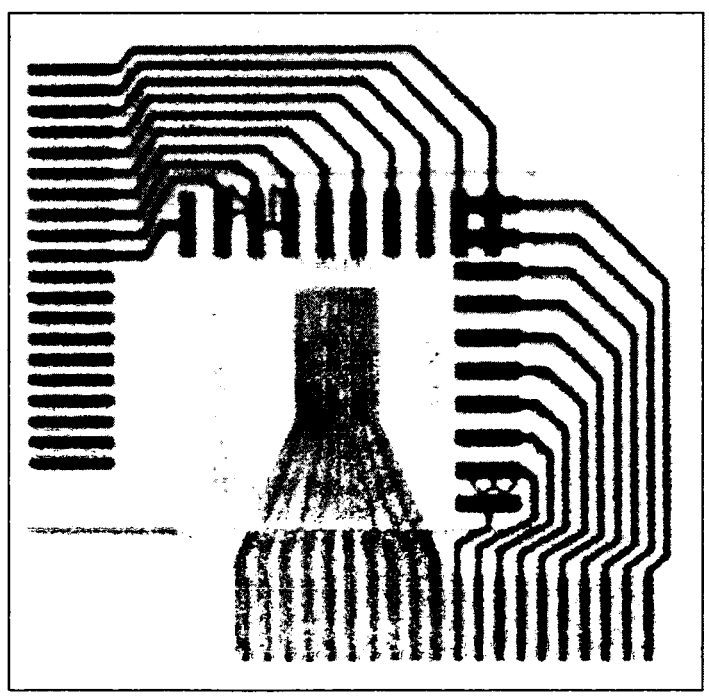
FIG. 23 includes an illustration of a top view of an electronic device including bonded substrates.
Figure 24:
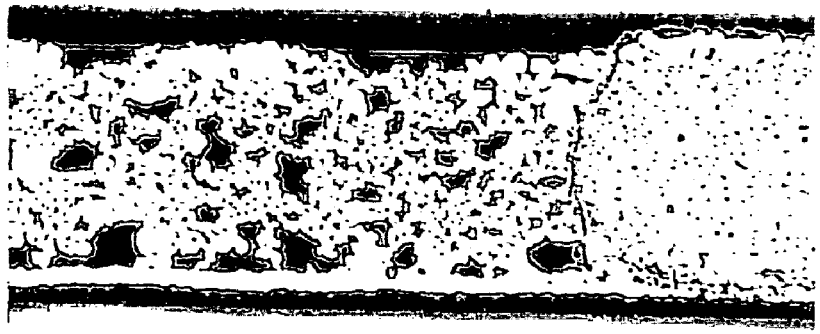
FIG. 24 includes an illustration of top view of one of the workpieces after removing the other substrate.
Figure 24:

Two nominal 10 cm×10 cm substrates are used in this example. Each substrate is glass with 10 ITO strips, each having a thickness of approximately 110 nm and a width of approximately 350 microns. The distance between adjacent strips on each substrate is approximately 150 microns. On one substrate, a layer of indium is thermally deposited through a shadow mask onto the surface of the ITO strips in a vacuum of approximately $1 \times 10^{-6}$ Torr. The thickness of the indium layer is approximately 650 nm. After the indium layer is deposited, the two substrates, one with the indium layer, the other one without the indium layer, are bonded together by heat curable epoxy. The ITO strips on each substrate are aligned to be perpendicular to each other. In that way, as seen from a top view, the overlapping area between two strips on separate substrates is approximately 350 microns×350 microns. The total number of pixels formed by the bonded substrates 230 is 100 (10×10). FIG. 23 includes an illustration of the bonded substrates 230. Before metal reflowing, the resistance between each strip on separate substrates is extremely high due to the gap between the indium layer (attached to one of the substrates) and the ITO layer of the other substrate. The bonded substrates 230 are heated to approximately 160° C. on a hot plate set at a temperature of 160° C. When the temperature reaches approximately 160° C., the indium melts. The metal reflowing process can take less than 5 seconds at approximately 160° C. to complete. After the reflowing process, the resistance between each pair of strips on separate substrates is approximately 400Ω, indicating that an electrical connection has been made. The resistance between each pair of strips on the same substrate remains extremely high, implying that the reflowed indium did not electrically short the strips in a lateral direction. FIG. 24 includes an illustration of a top view of the reflowed indium 242 on ITO strips 244 over one of the substrates 246 after removing the other substrate. FIG. 24 illustrates that the surface tension helps to pull the indium 242, as it is reflowed, away from the edge of the ITO strips 244, which significantly reduces the likelihood of an unintended electrical connection or leakage path between neighboring ITO strips 244.

Example 3

Example 3 demonstrates that a passive matrix display and a backlight can be formed using a reflow process.

In Example 3, the workpiece includes a driving panel that is a backlight panel. An metallic alloy layer, including approximately 40 weight % In, 40 weight % Sn, and 20 weight % Pb, of approximately 1.5 microns thick is thermally deposited on top of ITO in a vacuum of less than approximately $1 \times 10^{-6}$ Torr. The other workpiece includes an OLED panel that is a backlight panel with a passive matrix pixelated area with ITO as a common electrode (e.g., cathode). The pixelated area is made by forming negative photoresist banks. Since the height of the photoresist bank is approximately 3 microns, a gap of approximately 1 micron lies between the indium layer and the cathode of the OLED device during the panel bonding. The total pixel count is approximately 100× 50, with pitch size of approximately 100 microns×300 microns. The openings of the photoresist bank for each pixel are approximately 75 microns×200 microns, translating into an aperture ratio of approximately 48%. The OLED device on the OLED panel can be made using conventional techniques. A buffer layer can be spin-coated, followed by spin-coating a light-emitting polymer layer that includes MEH-PPV for this example. The cathode is thermally deposited over the light-emitting polymer layer.

A heat curable epoxy is deposited along the edge of the OLED panel. The driving panel and OLED panel are aligned to each other and then the panels are pressed together. After two panels are pressed together, the epoxy is cured at approximately 60° C. for approximately 30 minutes. A metal reflowing process is performed by heating the bonded panels to approximately 160° C. on a hot plate set at a temperature of 160° C. When the temperature of the panels reaches approximately 160° C., the indium melts. The metal reflowing process can take less than 5 seconds at approximately 160° C. to complete. The cathode of each OLED pixel in the pixelated area and the backlight region are electrically connected to the driving panel by the reflowed indium. When DC voltage is applied between the driving panel and the OLED panel, all the passive pixels and the backlight portion are turned on and emit light. Note that no significant current flows through the photoresist bank.

Example 4

Example 4 demonstrates that an AMOLED display that is formed using a reflow process described herein can have a significantly greater aperture ratio compared to a conventional AMOLED display. Example 4 also demonstrates that electrodes can be formed after the substrate structure is formed, wherein electrical shorts or leakage paths are not formed between the electrodes. For this Example 4, the AMOLED display formed at least in part with a reflow process will be referred to as the "Reflowed AMOLED Display," and the conventional AMOLED display will be referred to as the "Conventional AMOLED Display."

For each AMOLED display, the light-emitting area is approximately 9.4 cm (3.78 inches) (diagonally measured) with QVGA format of 320×RGB×240. A substrate structure 256 is formed and defines openings (wells) 254, as illustrated by the ovals in FIG. 25. The pixel resolution is approximately 40 pixels per centimeter (approximately 100 pixels per inch) with a pitch size of approximately 240 microns×240 microns.

For the Reflowed AMOLED Display, two workpieces are used. One of the workpieces includes a common electrode (e.g., a common anode) and a substrate structure 256 that are sequentially formed over a substrate. As seen from a cross-sectional view (not illustrated), the substrate structure has a height of approximately 3 microns and walls with a negative slope. Red, green, and blue light-emitting organic materials are deposited into their respective openings 254. Electrodes that are cathodes in one embodiment are thermally deposited over the red, green, and blue light-emitting organic materials. A combined thickness of each electrode and its corresponding light-emitting organic material is approximately 0.5 microns. The substrate structure 256, due to its height and negative slope, helps to reduce the likelihood that electrical shorts or leakage paths are formed between the electrodes.

The second workpiece is an active matrix TFT panel that includes conductors electrically connected to control circuits within the active matrix TFT panel. The layout of the control circuits is designed, such that after joining the two workpieces, at least portions of the control circuits will overlie or underlie the substrate structure 256. The design helps to increase the aperture ratio. A layer of indium with a thickness of approximately 1.5 microns is thermally deposited in a vacuum over the conductors. A metal etch process can be used to pattern the indium layer to complete formation of the conductive members. After metal etching, each conductor has a corresponding conductive member with a height of approximately 1.5 microns.

Because the height of the substrate structure 256 is approximately 3 microns, a gap of approximately 1 micron exists between the conductive members (of the active matrix TFT panel) and the electrodes (of the OLED panel) during the alignment. After the alignment, the active matrix TFT panel and the OLED panel are physically bonded together by epoxy deposited around the display area. A metal reflowing process is performed by heating the bonded panels to approximately 160° C. on a hot plate set at the temperature of 160° C. When the temperature of the conductive members exceeds approximately 156° C., the indium melts. The metal reflowing process can take less than 5 seconds at approximately 160° C. to complete. The electrode of each OLED pixel or subpixel is electrically connected to its respective control circuit by the reflowed indium. For the Reflowed AMOLED Display, the aperture ratio is approximately 65%.

Figure 25:
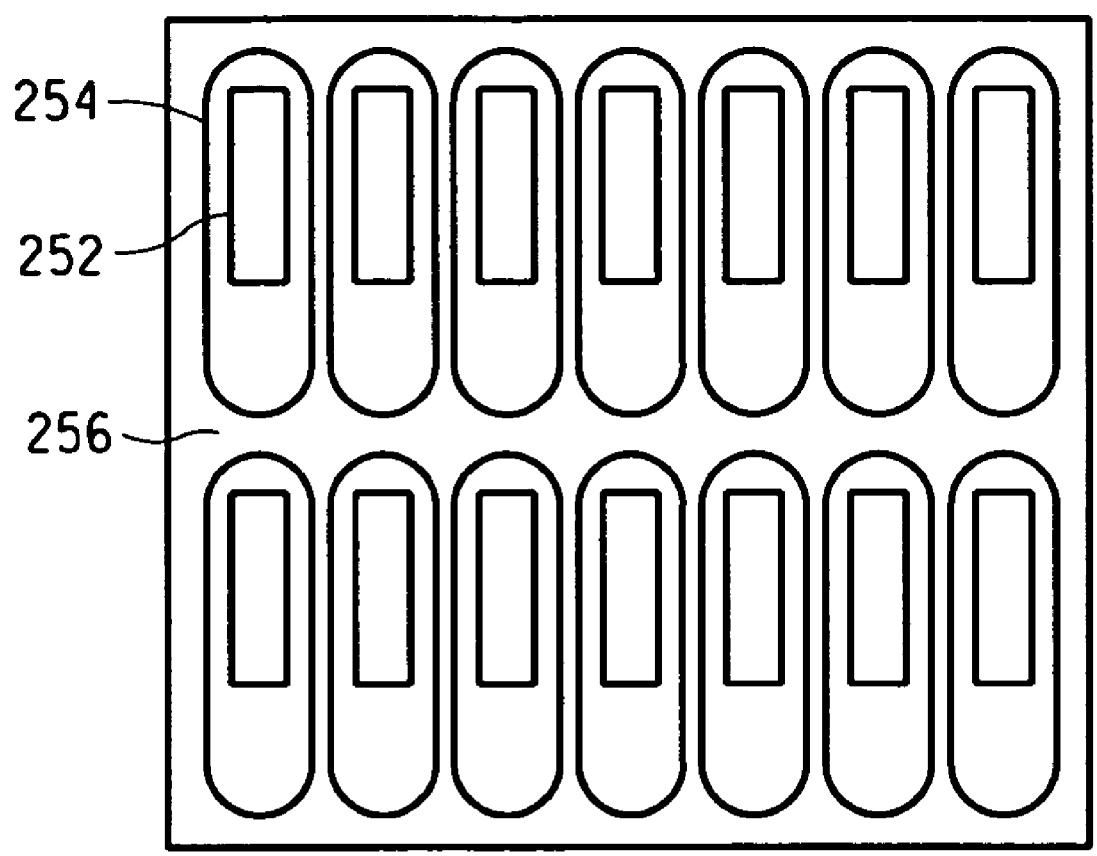
FIG. 25 includes an illustration of a top view of a layout of an AMOLED display illustrating positional relationships between different parts of a pixel array.

For the conventional AMOLED Display, control circuits and peripheral electronics (i.e., row/column drivers, row/column decoders, etc.) are formed over a substrate. The radiation-emitting components for the Conventional AMOLED Display are formed over the same substrate having the control circuits using conventional techniques. The Conventional AMOLED Display includes transparent anodes and a reflecting common cathode. Because the control circuits block some of the radiation that is emitted, the rectangles 252 in FIG. 25 illustrate the radiation emitting area that remains visible to a user. The Conventional AMOLED Display has an aperture ratio of approximately 16%, which is significantly less than the Reflowed AMOLED Display.

Example 5

Example 5 demonstrates that non-functional portions of an electronic device can be repaired using the metal reflow process.

The OLED display fabricated in Example 4 may have some non-functional portion, as some conductive members (e.g., indium bumps) may not have properly reflowed. A test can be performed to determine which pixels or subpixels have electrical opens or resistance too high between a power transistor 126 and its corresponding electronic components 128, 148, or 168. For each pixel or subpixel having an electrical open, a pulsed UV excimer laser emitting light at approximately 260 nm is used to repair the non-functional pixels or subpixels. The pulse width of the laser light is in the millisecond range. By focusing the excimer laser beam with power output of approximately 1 mW onto the non-functional pixel or subpixel, the input power can reach approximately 30 W/cm$^2$. With this power density, the conductive member can be re-melted, resulting in an electrical connection between the non-functional pixel's or subpixel's cathode and the corresponding power transistor 126. Thus, the non-functional pixel or subpixel is repaired, so that it becomes functional. The pixel or subpixel can be turned on after the laser repairing process.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An electronic device comprising:
   a first workpiece comprising:
      a first electronic component that includes a first electrode and a first organic layer; and a substrate structure lying adjacent to the first electronic component;

a second workpiece comprising a first conductor; and a first conductive member that is substantially directly bonded to the first electrode and the first conductor, wherein the first conductive member has a melting point no greater than 240° C., and the first conductive member has a higher surface energy than that of both the first electrode and the first conductor.

2. The electronic device of claim 1, wherein a width of the first conductive member at a point about hallWay between the first electrode and first conductor is wider than a width of the first conductive member at a point closer to the first electrode or the first conductor.

3. The electronic device of claim 1, wherein the first conductive member has a height of at least 3.5 microns.

4. The electronic device of claim 1, further comprising at least 4,000 other conductive members, wherein:

the first workpiece further comprises at least 4,000 other electronic components, wherein each of the at least 4,000 other electronic components comprises a first electrode;

the second workpiece further comprises other conductors substantially similar to the first conductor; and each of first conductive member and the at least 4,000 other conductive members is substantially directly bonded to at least one of the first electrodes and to the first conductor or any of at least 4,000 other conductors.

5. The electronic device of claim 1, wherein:

the first electronic component comprises a radiation-emitting component, a radiation-responsive component, or a combination thereof; and the second workpiece comprises a first control circuit to control the first electronic component, wherein the first control circuit is electrically connected to the first conductor.

6. The electronic device of claim 5, wherein the radiation-emitting component, radiation-responsive component, or combination thereof, emits radiation or responds to radiation transmitted through the first workplace, the second workpiece, or a combination thereof 7. The electronic device of claim 5, further comprising a second conductive member and a third conductive member, wherein:

the first electronic component is a red light-emitting component;

the first organic layer comprises a red light-emitting organic layer;

the first workpiece further compnses:

a green light-emitting component that includes a first electrode and a green light-emitting organic layer and a blue light-emitting component that includes a first electrode and a blue light-emitting organic layer;

the substrate structure lies between the red light-emitting component, the green light-emitting component, and the blue light-emitting component;

the second workpiece comprises:

a second control circuit to control the green light-emitting component, wherein the second control circuit is electrically connected to a second conductor; and a third control circuit to control the blue light-emitting component wherein the third control circuit is electrically connected to a third conductor, the second conductive member is substantially directly bonded to the first electrode of the green light-emitting component and the second conductor; and the third conductive member is substantially directly bonded to the first electrode of the blue light-emitting component and the third conductor.

8. The electronic device of claim 7, wherein:

the red light-emitting component, the green light-emitting component, and the blue light-emitting component share a common electrode; and radiation is transmitted through the common electrode of the red light-emitting component, the green light-emitting component, and the blue light-emitting component.

9. The electronic device of claim 1, wherein the first component is at least part of a backlight, a static image display, a passive matrix display, a sensor array, or a photovoltaic cell.

10. The electronic device of claim 1, wherein: the substrate structure contacts the second workpiece; or a layer overlying the substrate structure contacts the second workpiece, wherein the layer has a substantially same composition as the first electrode.

11. The electronic device of claim 1, further comprising a sealing material, wherein:

the sealing material is attached to the first and second workpieces outside of an array that includes the first electronic component; and a gas contacts and laterally surrounds the first conductive member.

12. The electronic device of claim 11, further comprising a second conductive member, wherein each of the first and second conductive members contacts the first electrode and the first conductor.

13. The electronic device of claim 1, further comprising an encapsulating layer that contacts the first workpiece, the second workpiece and the first conductive member.

14. The electronic device of claim 1, wherein the first conductive member comprises a metal-containing material having at least one void.

15. An electronic device comprising:

a first workpiece comprising:

a first electronic component comprising a radiation-emitting component; that includes a first electrode and a first active organic layer, and a substrate structure lying adjacent to the first electronic component;

a second workpiece comprising a first control circuit to control the first electronic component, wherein the first control circuit is electrically connected to a first conductor; and wherein:

the substrate structure contacts the second workpiece; or a layer overlying the substrate structure contacts the second workpiece, wherein the layer has a substantially same composition as the first electrode; and a first conductive member that is substantially directiy bonded to the first electrode and the first conductor, wherein the first conductive member has a melting point no greater than 240° C., and the first conductive member has a higher surface energy than that of both the first electrode and the first conductor.

16. The electronic device of claim 15, wherein a width of the first conductive member at a point about halfway between the first electrode and first conductor is wider than a width of the first conductive member at a point closer to the first electrode or the first conductor.

17. The electronic device of claim 15, wherein the first conductive member comprises a metal-containing material having at least one void.

18. The electronic device of claim 15, wherein the radiation-emitting component emits radiation through the first workpiece, the second workpiece or a combination thereof.

* * * * *